US010074922B2

United States Patent
Kakiuchi et al.

(10) Patent No.: US 10,074,922 B2
(45) Date of Patent: Sep. 11, 2018

(54) ACTUATOR DEVICE, LIQUID EJECTOR, AND CONNECTION STRUCTURE FOR CONNECTING FIRST CONTACTS AND SECOND CONTACTS OF WIRE MEMBER

(71) Applicant: BROTHER KOGYO KABUSHIKI KAISHA, Nagoya-shi, Aichi-ken (JP)

(72) Inventors: Toru Kakiuchi, Aichi-ken (JP); Yasuo Kato, Aichi-ken (JP); Rui Wang, Nagoya (JP); Yuichi Ito, Mie-ken (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 15/472,022

(22) Filed: Mar. 28, 2017

(65) Prior Publication Data

US 2018/0090866 A1 Mar. 29, 2018

(30) Foreign Application Priority Data

Sep. 28, 2016 (JP) .................. 2016-189990

(51) Int. Cl.
| | |
|---|---|
| *B41J 2/14* | (2006.01) |
| *H01R 12/77* | (2011.01) |
| *H01L 41/09* | (2006.01) |
| *H01L 41/047* | (2006.01) |
| *H01R 13/22* | (2006.01) |
| *H01L 41/187* | (2006.01) |

(52) U.S. Cl.
CPC .......... *H01R 12/771* (2013.01); *B41J 2/1433* (2013.01); *B41J 2/14201* (2013.01); *H01L 41/0477* (2013.01); *H01L 41/09* (2013.01); *H01R 13/22* (2013.01); *H01L 41/1876* (2013.01)

(58) Field of Classification Search
CPC .......... B41J 2/14201; B41J 2/14274; B41J 2/14209; B41J 2/14233; B41J 2/1623; H01L 41/09; H01L 41/1876; H01L 41/0477; H01R 12/771; H01R 13/22
See application file for complete search history.

(56) References Cited

U.S. PATENT DOCUMENTS 9,238,364 B2 * 1/2016 Kondo ................ B41J 2/14233
2014/0292942 A1 10/2014 Torimoto et al.

FOREIGN PATENT DOCUMENTS

| JP | 2014-188716 A | 10/2014 |
|---|---|---|
| JP | 2014-188782 A | 10/2014 |

* cited by examiner

*Primary Examiner* — Juanita D Jackson
(74) *Attorney, Agent, or Firm* — Merchant & Gould P.C.

(57) ABSTRACT

An actuator device includes: an actuator including first contacts arranged in a first direction; and a wire member including second contacts and joined to the actuator. The second contacts are arranged in the first direction and respectively connected to the first contacts. Each of particular contacts as the first contacts or the second contacts has a protruding and recessed portion including: at least two protrusions; and a recess between the at least two protrusions. The particular contacts include: at least one central-region contact disposed on a central region in the first direction; and at least one end-region contact disposed nearer to an end region than to the central region in the first direction. The protruding and recessed portion of each of the at least one central-region contact is different in shape from the protruding and recessed portion of each of the at least one end-region contact.

26 Claims, 23 Drawing Sheets

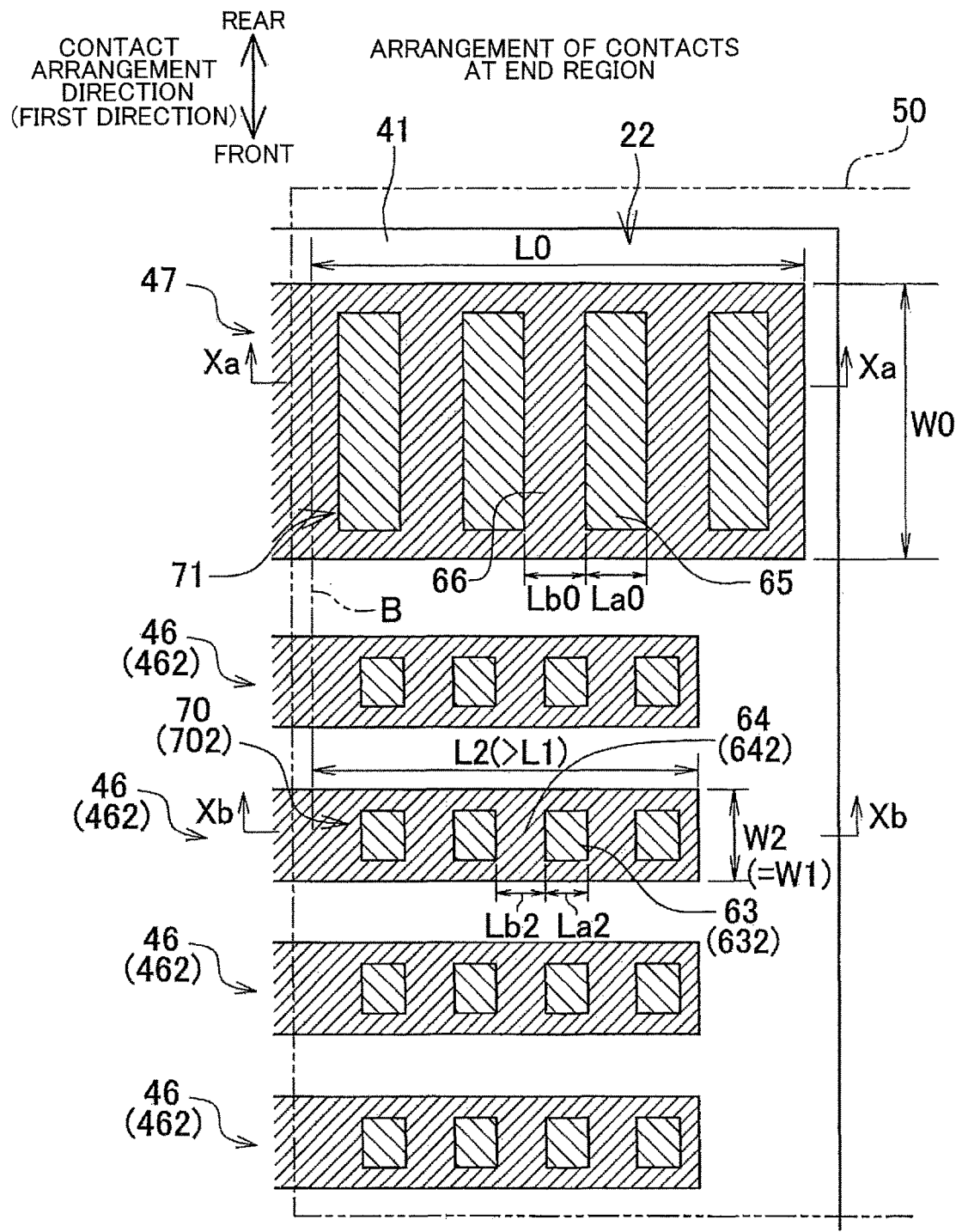

WIRE EXTENDING DIRECTION
(SECOND DIRECTION)
LEFT ⇐⇒ RIGHT

WIRE EXTENDING DIRECTION
(SECOND DIRECTION)
LEFT ⟵⟶ RIGHT

SCANNING DIRECTION
(SECOND DIRECTION)
LEFT ⟵⟶ RIGHT

FIG.15
END REGION
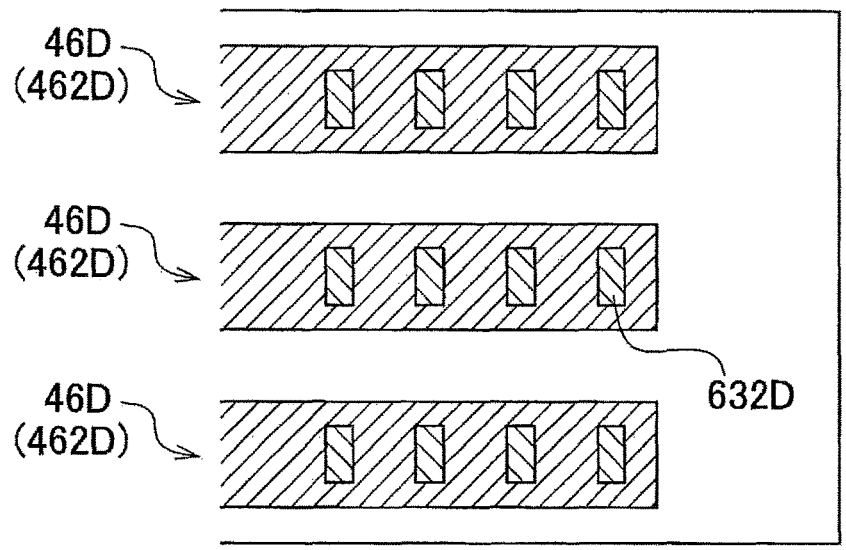
CENTRAL REGION
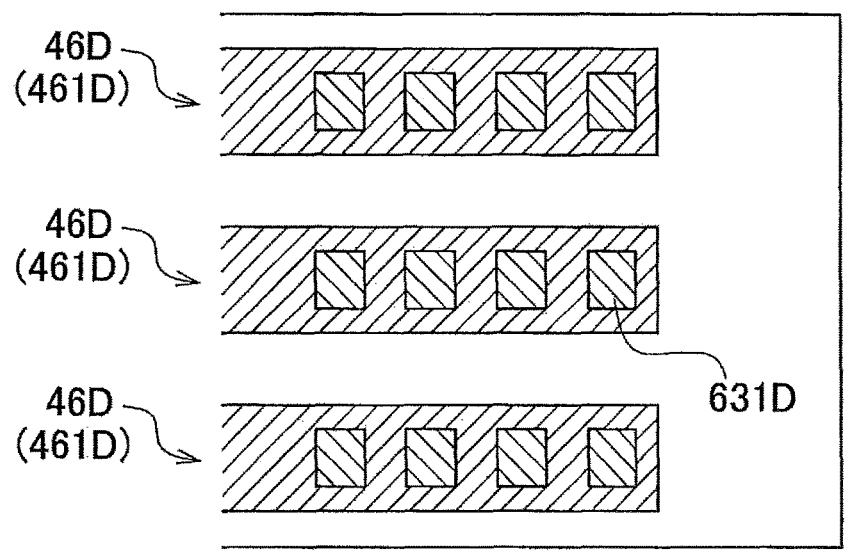
CONTACT ARRANGEMENT DIRECTION (FIRST DIRECTION) REAR ↑↓ FRONT
WIRE EXTENDING DIRECTION (SECOND DIRECTION) LEFT ⟷ RIGHT

FIG.17
END REGION
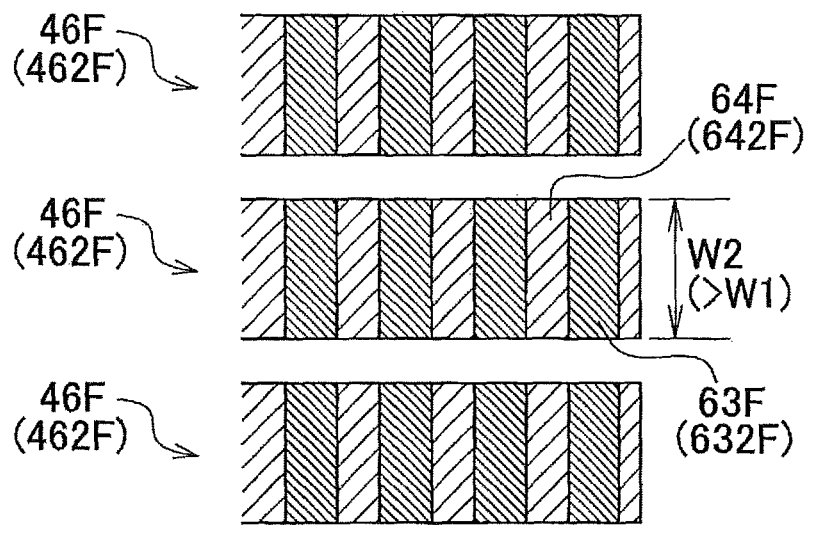
CENTRAL REGION
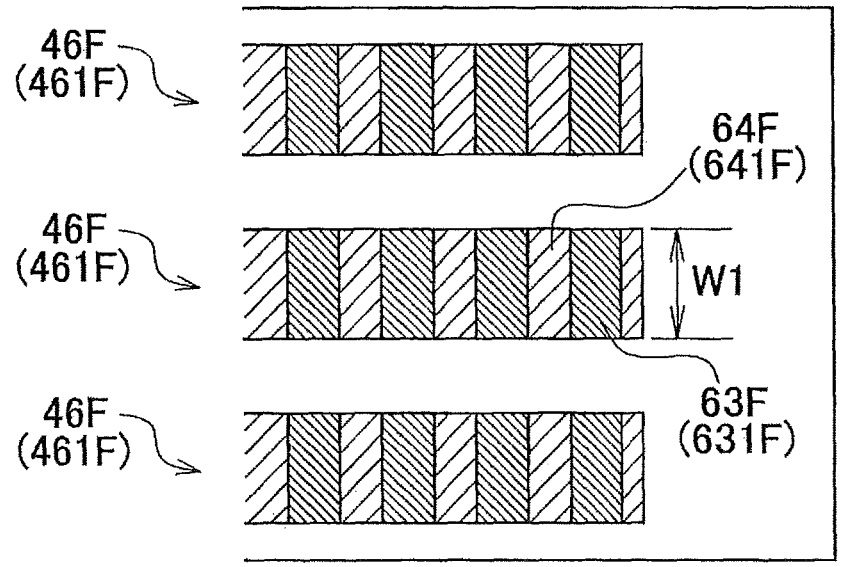
CONTACT ARRANGEMENT DIRECTION (FIRST DIRECTION)
REAR ↑ ↓ FRONT
WIRE EXTENDING DIRECTION (SECOND DIRECTION)
LEFT ⟵⟶ RIGHT

FIG.18
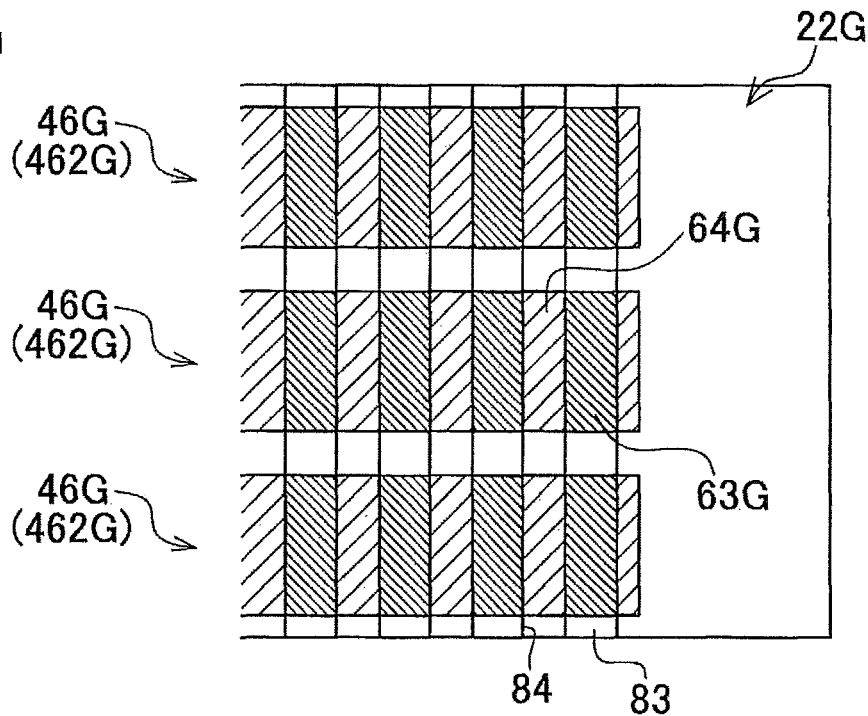
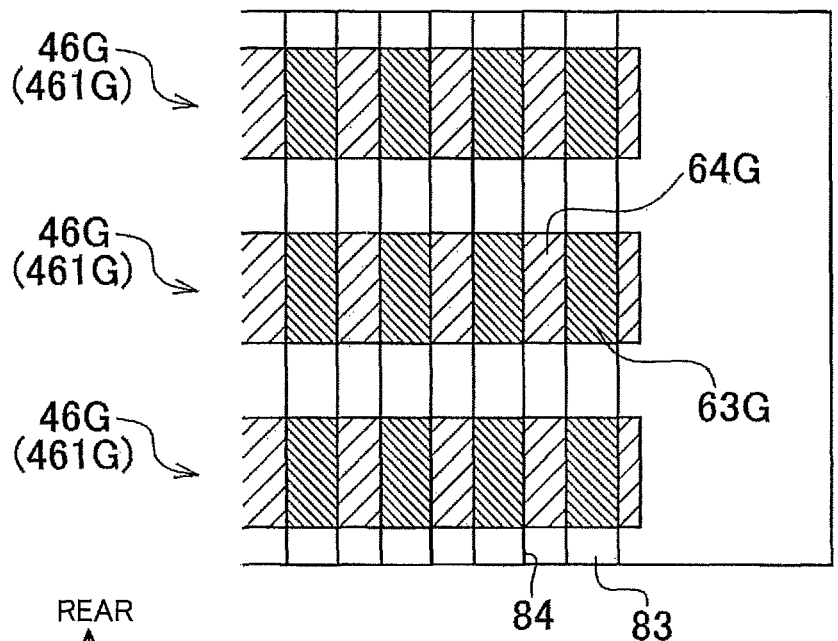

FIG.20
END REGION
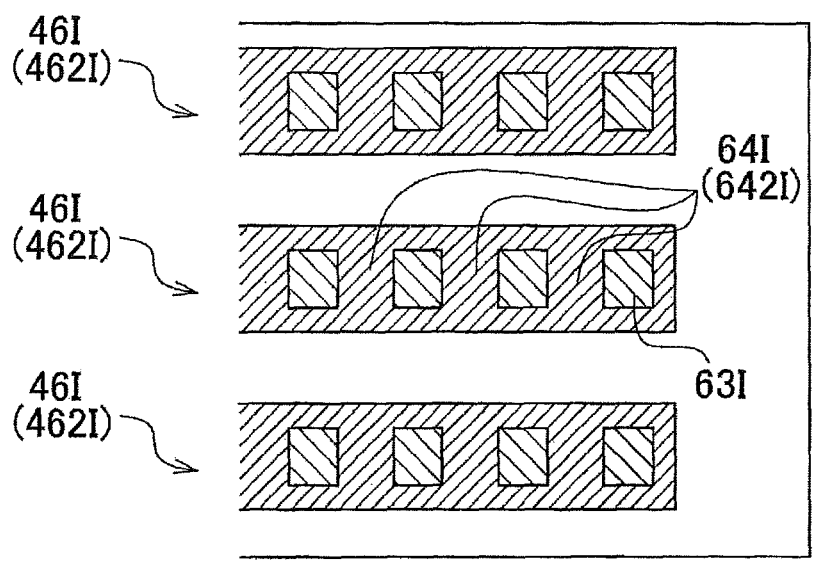
CENTRAL REGION
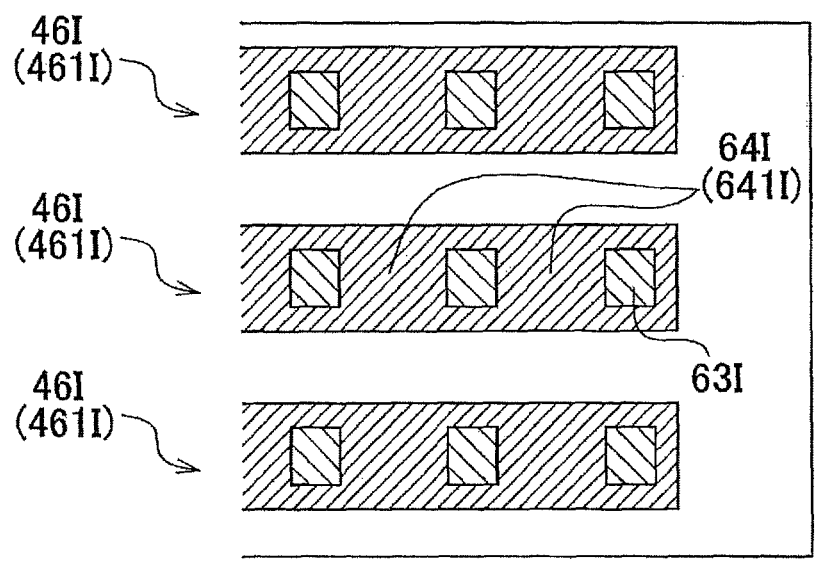
CONTACT ARRANGEMENT DIRECTION (FIRST DIRECTION) REAR ↕ FRONT
WIRE EXTENDING DIRECTION (SECOND DIRECTION) LEFT ⟷ RIGHT

FIG.21
END REGION
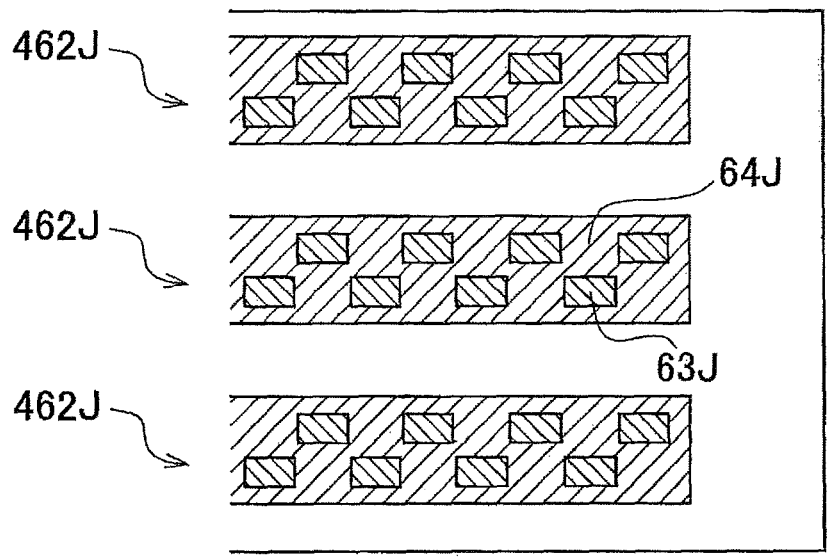
CENTRAL REGION
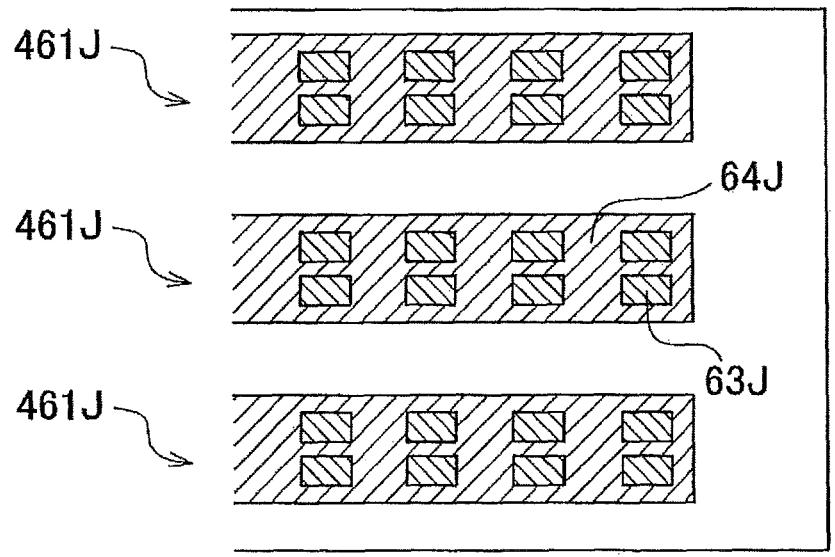
CONTACT ARRANGEMENT DIRECTION (FIRST DIRECTION) REAR ↑↓ FRONT
WIRE EXTENDING DIRECTION (SECOND DIRECTION) LEFT ⟵⟶ RIGHT

WIRE EXTENDING DIRECTION
(SECOND DIRECTION)
LEFT ⟵⟶ RIGHT

ACTUATOR DEVICE, LIQUID EJECTOR, AND CONNECTION STRUCTURE FOR CONNECTING FIRST CONTACTS AND SECOND CONTACTS OF WIRE MEMBER

CROSS REFERENCE TO RELATED APPLICATION

The present application claims priority from Japanese Patent Application No. 2016-189990, which was filed on Sep. 28, 2016, the disclosure of which is herein incorporated by reference in its entirety.

BACKGROUND

The present disclosure relates to an actuator device, a liquid ejector, and a connection structure for connecting a plurality of first contacts and a plurality of second contacts of a wire member to each other.

There is known a liquid ejector including: a passage definer having pressure chambers respectively communicating with nozzles; and a piezoelectric actuator configured to apply ejection energy to ink in the pressure chambers.

The piezoelectric actuator includes piezoelectric elements respectively corresponding to the pressure chambers. Contacts are drawn out from individual electrodes of the respective piezoelectric elements and arranged in a row at an end portion of the actuator. A wire member (a flexible cable) is joined to the end portion of the actuator with non-conductive adhesive (e.g., NCP) in a state in which the contacts disposed on the actuator and contacts disposed on the wire member are respectively in contact with each other.

A plurality of grooves are formed in the end portion of the actuator at a region at which the wire member is joined to the actuator. These grooves extend in a direction in which the contacts are arranged. These grooves form protrusions and recesses on and in each of the contacts. The protrusions and recesses are arranged alternately in a direction orthogonal to the arrangement direction. In this construction, when the wire member is joined to the actuator with the non-conductive adhesive, the adhesive is hardened with its portion located in the recesses. This hardening increases a joining force between the contacts disposed on the actuator and the contacts disposed on the wire member.

SUMMARY

A substrate of a flexible wire member is generally constituted by a resin film formed of polyimide, for example. This resin film is readily contracted by changes in environmental temperature and/or humidity or by heating when the wire member is joined with adhesive. During contraction of the film, a force is applied to joint portions of the actuator and the wire member. Here, a magnitude of a force applied to the joint portions varies depending upon positions of the contacts. For example, in the case where the wire member is joined to the actuator with center alignment in a contact arrangement direction, if the wire member is contracted by heat during joining, a larger force is prone to be applied to the contacts located at end regions than to the contacts located at a central region. Accordingly, the joint portions are preferably devised at the contacts located at the end regions to make the joining force stronger at the contacts located at the end regions than at the contacts located at the central region.

Accordingly, an aspect of the disclosure relates to a technique for reliably preventing positional misalignment and separation of a wire member by increasing a joining force between contacts at an end portion of the wire member at which a large force is applied in particular.

In one aspect of the disclosure, an actuator device includes: an actuator including a plurality of first contacts arranged in a first direction; and a wire member including a plurality of second contacts and joined to the actuator. The plurality of second contacts are arranged in the first direction and respectively connected to the plurality of first contacts. Each of a plurality of particular contacts includes a protruding and recessed portion including: at least two protrusions; and a recess interposed between the at least two protrusions, and the plurality of particular contacts are the plurality of first contacts or the plurality of second contacts. The plurality of particular contacts include: at least one central-region contact disposed on a central region in the first direction; and at least one end-region contact disposed nearer to an end region than to the central region in the first direction. A shape of the protruding and recessed portion of each of the at least one central-region contact is different from that of the protruding and recessed portion of each of the at least one end-region contact.

In another aspect of the disclosure, a liquid ejector includes: a passage definer including a plurality of pressure chambers; a plurality of drive elements provided on the passage definer so as to respectively correspond to the plurality of pressure chambers; an actuator including a plurality of first contacts respectively drawn from the plurality of drive elements and arranged in a first direction; and a wire member including a plurality of second contacts arranged in the first direction and respectively connected to the plurality of first contacts. Each of a plurality of particular contacts includes a protruding and recessed portion including: at least two protrusions; and a recess interposed between the at least two protrusions, and the plurality of particular contacts are the plurality of first contacts or the plurality of second contacts. The plurality of particular contacts include: at least one central-region contact disposed on a central region in the first direction; and at least one end-region contact disposed nearer to an end region than to the central region in the first direction. A shape of the protruding and recessed portion of each of the at least one central-region contact is different from that of the protruding and recessed portion of each of the at least one end-region contact.

In yet another aspect of the disclosure, a connection structure for connecting a plurality of first contacts and a plurality of second contacts of a wire member to each other. The plurality of first contacts are arranged in a first direction. The plurality of second contacts are arranged in the first direction. Each of a plurality of particular contacts includes a protruding and recessed portion including: at least two protrusions; and a recess interposed between the at least two protrusions, and the plurality of particular contacts are the plurality of first contacts or the plurality of second contacts. The plurality of particular contacts include: at least one central-region contact disposed on a central region in the first direction; and at least one end-region contact disposed nearer to an end region than to the central region in the first direction. A shape of the protruding and recessed portion of each of the at least one central-region contact is different from that of the protruding and recessed portion of each of the at least one end-region contact.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIG. 9 is a plan view of the driving contacts and ground contact disposed at an area B2 in FIG. 2;

FIG. 15 is a plan view of driving contacts in yet another modification;

FIG. 17 is a plan view of driving contacts in yet another modification;

FIG. 18 is a plan view of driving contacts in yet another modification;

FIG. 20 is a plan view of driving contacts in yet another modification;

FIG. 21 is a plan view of driving contacts in yet another modification;

DETAILED DESCRIPTION OF THE EMBODIMENT

Figure 1:
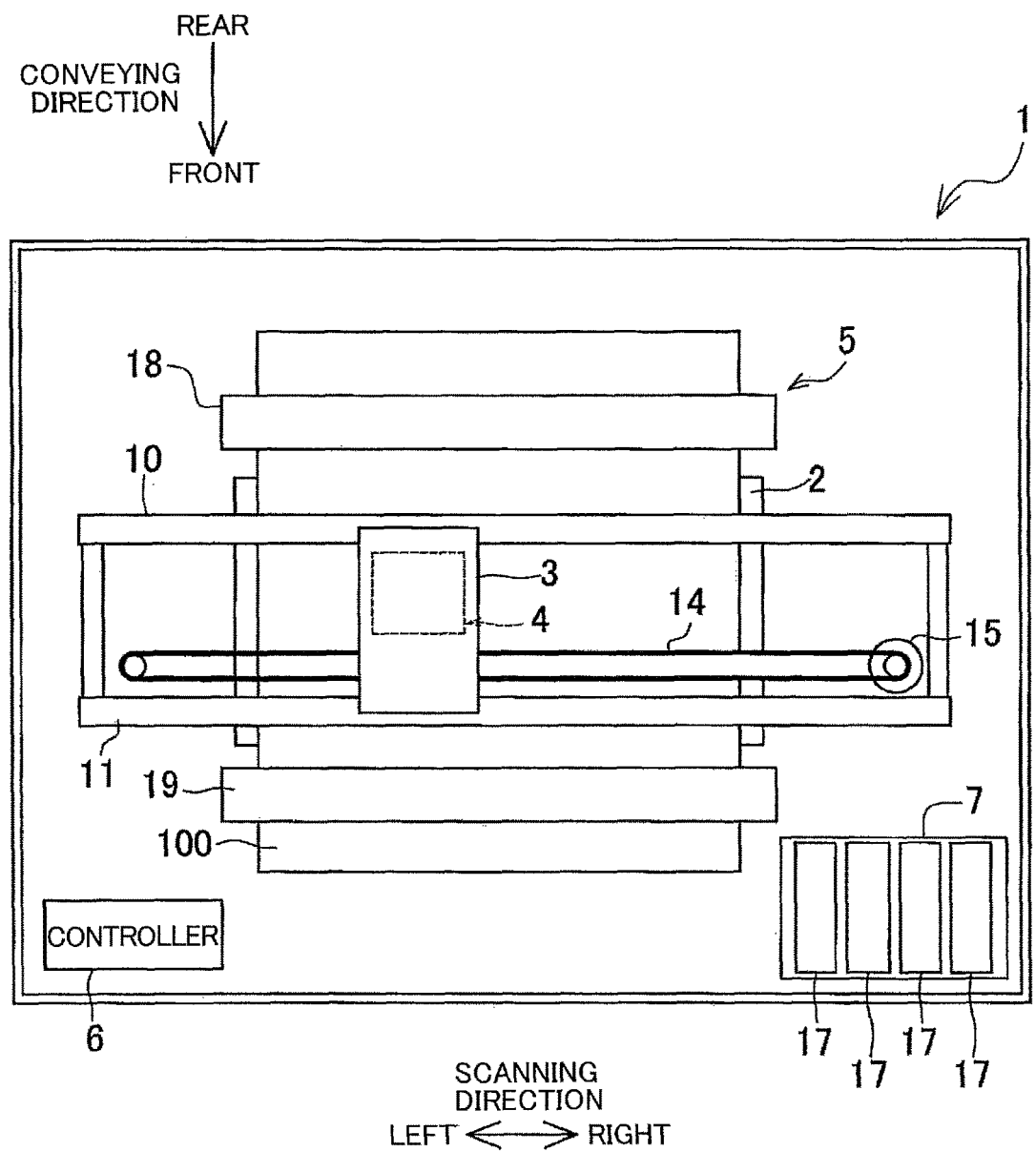
FIG. 1 is a schematic plan view of a printer according to one embodiment.

Hereinafter, there will be described an embodiment by reference to the drawings. First, there will be explained an overall configuration of an ink-jet printer 1 with reference to FIG. 1. The direction in which a recording sheet 100 is conveyed in FIG. 1 is defined as the front and rear direction of the printer 1. The widthwise direction of the recording sheet 100 is defined as the right and left direction of the printer 1. The direction orthogonal to the front and rear direction and the right and left direction and perpendicular to the sheet surface of FIG. 1 is defined as the up and down direction of the printer 1.

Overall Configuration of Printer

As illustrated in FIG. 1, the ink-jet printer 1 includes a carriage 3, an ink-jet head 4, a conveying mechanism 5, and a controller 6.

The carriage 3 is mounted on guide rails 10, 11 extending in the right and left direction (hereinafter may also be referred to as "scanning direction"). The carriage 3 is joined to a carriage driving motor 15 via an endless belt 14. The carriage 3 is driven by the motor 15 and reciprocated in the scanning direction over the recording sheet 100 conveyed on a platen 2.

The ink-jet head 4 is mounted on the carriage 3. Inks of four colors, namely, black, yellow, cyan, and magenta, are supplied to the ink-jet head 4 respectively via tubes, not illustrated, from four ink cartridges 17 held by a holder 7. While moving in the scanning direction with the carriage 3, the ink-jet head 4 ejects the inks from a multiplicity of nozzles 24 (see FIGS. 2-6) onto the recording sheet 100 conveyed on the platen 2.

The conveying mechanism 5 includes two conveying rollers 18, 19 configured to convey the recording sheet 100 on the platen 2 in the front direction (hereinafter may also be referred to as "conveying direction").

The controller 6 controls devices including the ink-jet head 4 and the carriage driving motor 15 to print an image on the recording sheet 100 based on a print instruction received from an external device such as a personal computer (PC).

Detailed Configuration of Ink-Jet Head

There will be next explained a configuration of the ink-jet head 4 with reference to FIGS. 2-6. It is noted that FIGS. 3 and 4 omit illustration of a protector 23 illustrated in FIG. 2.

In the present embodiment, the ink-jet head 4 ejects the inks of the four colors (black, yellow, cyan, and magenta). As illustrated in FIGS. 2-6, the ink-jet head 4 includes a nozzle plate 20, a passage definer 21, and an actuator device 25 including a piezoelectric actuator 22. In the present embodiment, the actuator device 25 does not indicate only the piezoelectric actuator 22 but includes not only the piezoelectric actuator 22 but also the protector 23 and chip-on-films (COFs) 50 disposed on the piezoelectric actuator 22. Each of the COFs 50 is one example of a wire member.

Nozzle Plate

The nozzle plate 20 is formed of silicon, for example. The nozzle plate 20 has the nozzles 24 arranged in the conveying direction. That is, the front and rear direction coincides with a nozzle arrangement direction in which the nozzles 24 are arranged.

Figure 2:
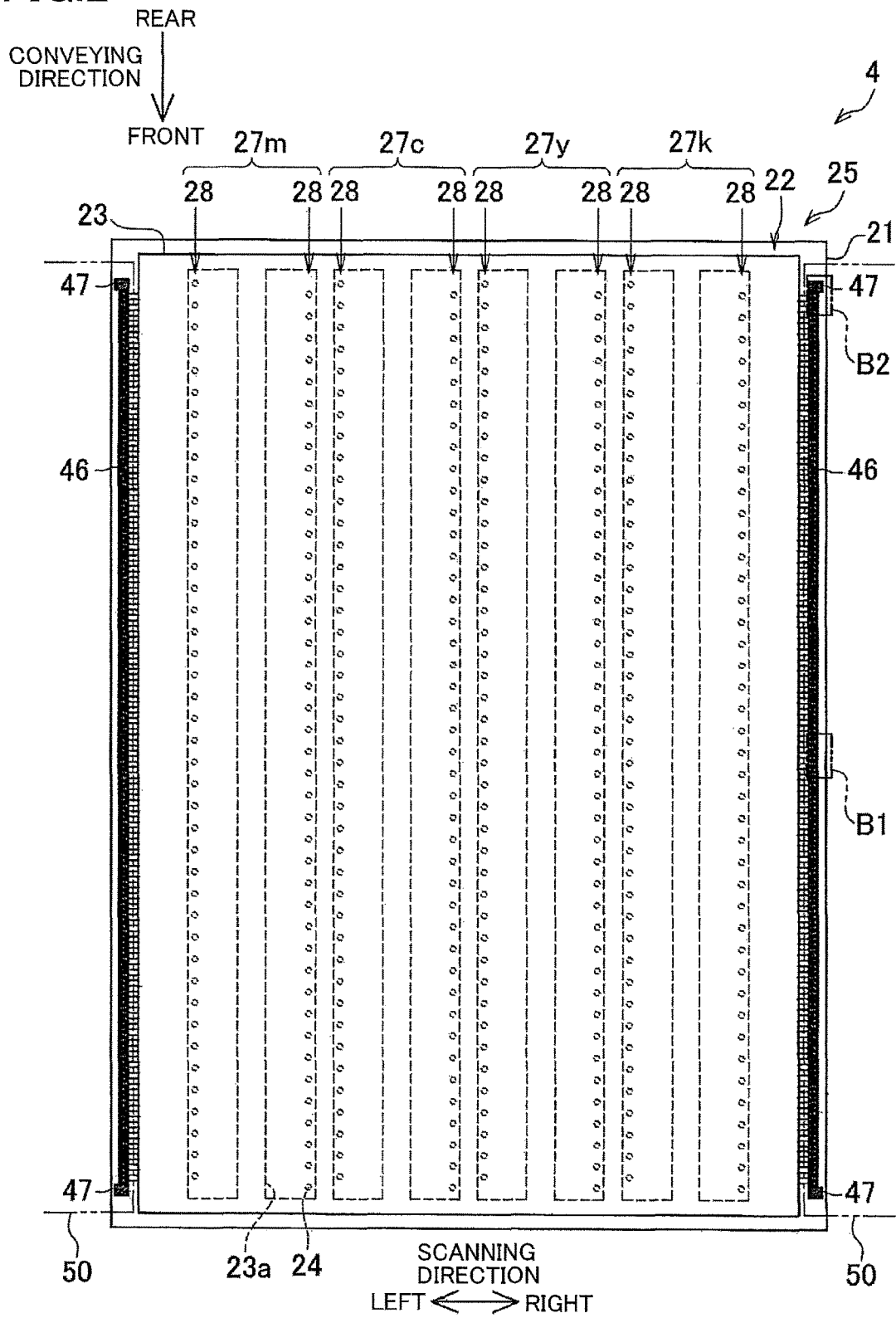
FIG. 2 is a plan view of an ink-jet head.
Figure 3:
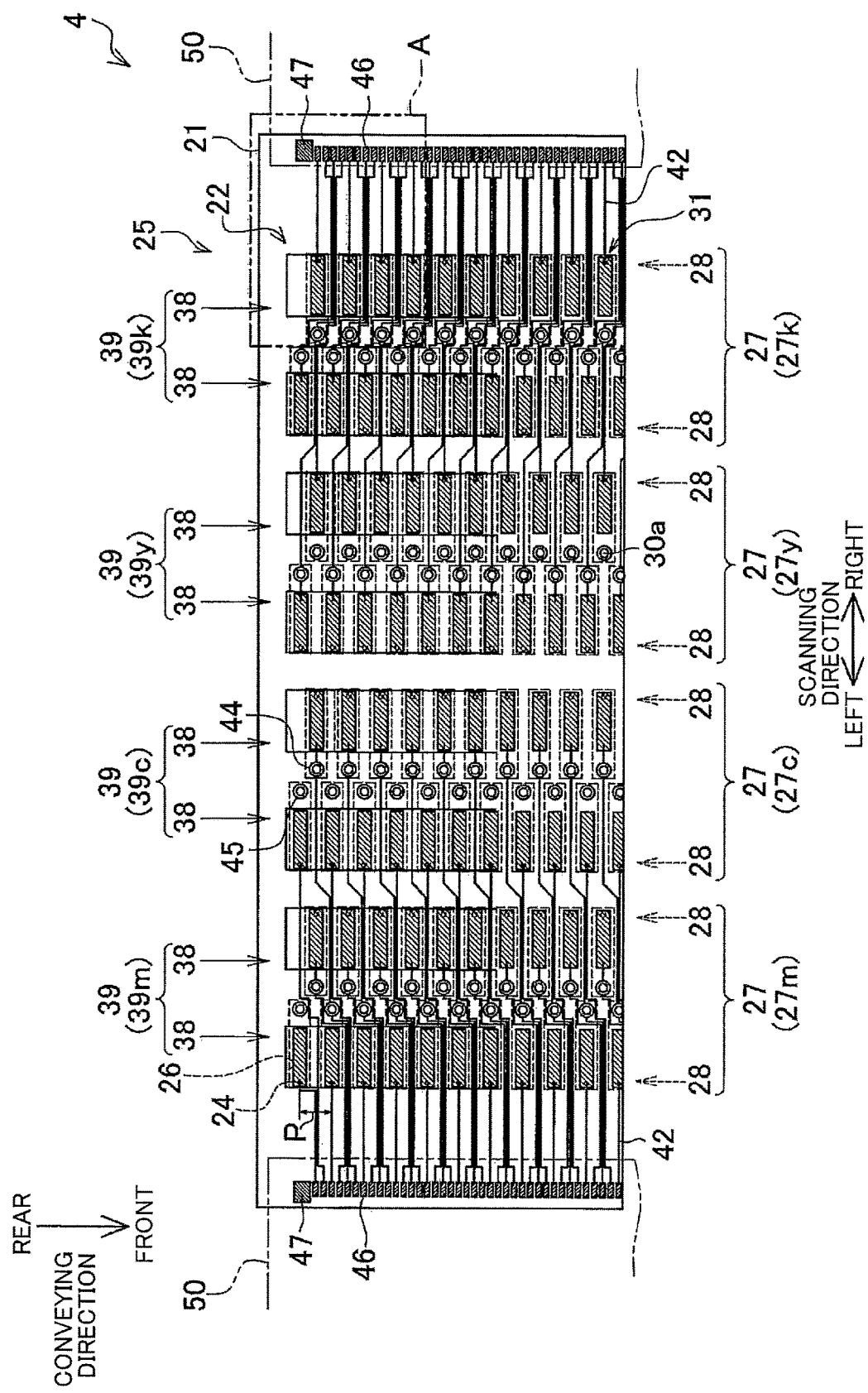
FIG. 3 is an enlarged view of a rear end portion of the ink-jet head in FIG. 2.

More specifically, as illustrated in FIGS. 2 and 3, the nozzle plate 20 has four nozzle groups 27 arranged in the scanning direction. The four nozzle groups 27 are for ejection of the different inks, respectively. Each of the nozzle groups 27 is constituted by right and left nozzle rows 28. In each of the nozzle rows 28, the nozzles 24 are arranged at arrangement pitches (intervals) P. Positions of the nozzles 24 are displaced by P/2 in the conveying direction between the two nozzle rows 28. That is, the nozzles 24 are arranged in two rows in a staggered configuration in each nozzle group 27.

In the following explanation, one of suffixes k, y, c, and m may be selectively added to the reference numbers of components of the ink-jet head 4 to indicate their respective correspondences with one of the black, yellow, cyan, and magenta inks. For example, the wording "nozzle groups 27$k$" indicates the nozzle group 27 for the black ink.

Passage Definer

The passage definer 21 is a base plate formed of silicon single crystal. As illustrated in FIGS. 3-6, the passage definer 21 has pressure chambers 26 communicating with the respective nozzles 24. Each of the pressure chambers 26 has a rectangular shape elongated in the scanning direction in plan view. The pressure chambers 26 are arranged in the conveying direction so as to correspond to the arrangement of the nozzles 24. The pressure chambers 26 are arranged in eight pressure chamber rows, each two of which correspond to one of the four ink colors. A lower surface of the passage definer 21 is covered with the nozzle plate 20. An outer end portion of each of the pressure chambers 26 in the scanning direction overlaps a corresponding one of the nozzles 24.

A vibration layer 30 of the piezoelectric actuator 22, which will be described below, is disposed on an upper surface of the passage definer 21 so as to cover the pressure chambers 26. The vibration layer 30 is not limited in particular as long as the vibration layer 30 is an insulating layer covering the pressure chambers 26. In the present embodiment, the vibration layer 30 is formed by oxidation or nitriding of a surface of the base plate formed of silicon. The vibration layer 30 has ink supply holes 30a at areas each covering an end portion of a corresponding one of the pressure chambers 26 in the scanning direction (which end portion is located on an opposite side of the pressure chamber 26 from the nozzle 24).

For each ink color, the ink is supplied from a corresponding one of four reservoirs 23b formed in the protector 23 to the pressure chambers 26 through the respective ink supply holes 30a. When ejection energy is applied to the ink in each of the pressure chambers 26 by a corresponding one of piezoelectric elements 31 of the piezoelectric actuator 22 which will be described below, an ink droplet is ejected from the nozzle 24 communicating with the pressure chamber 26.

Actuator Device

The actuator device 25 is disposed on the upper surface of the passage definer 21. The actuator device 25 includes: the piezoelectric actuator 22 including the piezoelectric elements 31; the protector 23; and the two COFs 50.

Figure 4:
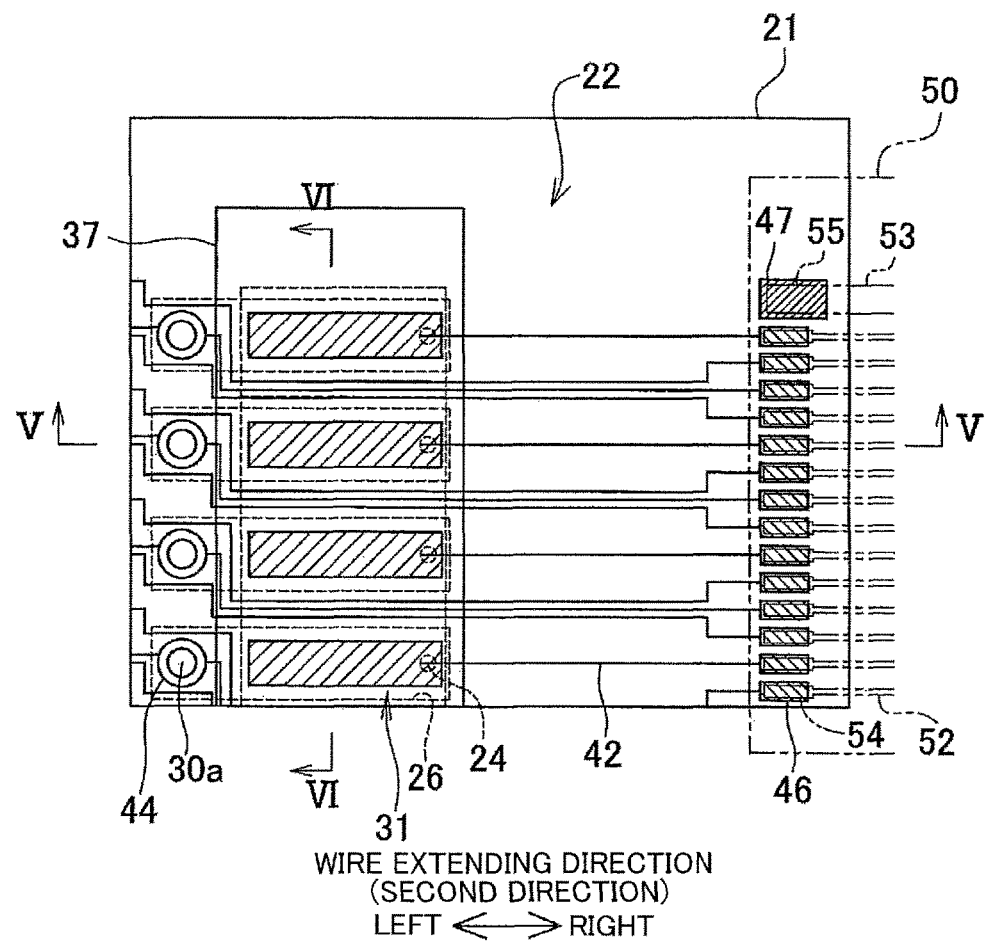
FIG. 4 is an enlarged view of an area A in FIG. 3.

The piezoelectric actuator 22 is disposed on the entire upper surface of the passage definer 21. As illustrated in FIGS. 3 and 4, the piezoelectric actuator 22 includes the piezoelectric elements 31 arranged so as to overlap the respective pressure chambers 26. The piezoelectric elements 31 are arranged in the conveying direction so as to correspond to the arrangement of the pressure chambers 26 and constitute eight piezoelectric element rows 38. A plurality of driving contacts 46 and two ground contacts 47 are drawn out leftward from left four of the piezoelectric element rows 38, and as illustrated in FIGS. 2 and 3 the contacts 46, 47 are disposed on a left end portion of the passage definer 21. A plurality of driving contacts 46 and two ground contacts 47 are drawn out rightward from right four of the piezoelectric element rows 38, and the contacts 46, 47 are disposed on a right end portion of the passage definer 21. The structure of the piezoelectric actuator 22 will be described below in detail.

The protector 23 is disposed on an upper surface of the piezoelectric actuator 22 so as to cover the piezoelectric elements 31. Specifically, the protector 23 includes eight recessed protecting portions 23a respectively covering the eight piezoelectric element rows 38. As illustrated in FIG. 2, the protector 23 does not cover right and left end portions of the piezoelectric actuator 22, so that the driving contacts 46 and the ground contacts 47 are exposed from the protector 23. The protector 23 has the reservoirs 23b connected to the respective ink cartridges 17 held by the holder 7. The ink in each of the reservoirs 23b is supplied to the pressure chambers 26 through respective ink supply passages 23c and the respective ink supply holes 30a formed in the vibration layer 30.

Each of the COFs 50 illustrated in FIGS. 2-5 is a flexible wire (lead) member including a base 56 formed of insulating material such as a polyimide film. A driver IC 51 is mounted on the base 56. One end portions of the respective two COFs 50 are connected to the controller 6 (see FIG. 1) of the printer 1. The other end portions of the respective two COFs 50 are respectively joined to right and left end portions of the piezoelectric actuator 22. As illustrated in FIG. 4, each of the COFs 50 includes ground wires 53 and a plurality of individual wires 52 connected to the respective driver ICs 51. Individual contacts 54 are provided on distal end portions of the respective individual wires 52 and connected to the respective driving contacts 46 of the piezoelectric actuator 22. Ground connection contacts 55 are provided on distal end portions of the respective ground wires 53 and connected to the respective ground contacts 47 of the piezoelectric actuator 22. Each of the driver ICs 51 outputs a drive signal to a corresponding one of the piezoelectric elements 31 of the piezoelectric actuator 22 via a corresponding one of the individual contacts 54 and a corresponding one of the driving contacts 46. While the two ground contacts 47 are provided for each of the COFs 50 in the present embodiment, the following explanation will be given for one of the ground contacts 47 for simplicity unless otherwise required.

Detailed Structure of Piezoelectric Actuator

The piezoelectric actuator 22 includes: the vibration layer 30 formed on the upper surface of the passage definer 21; and the piezoelectric elements 31 disposed on an upper surface of the vibration layer 30. For simplicity, FIGS. 3 and 4 omit illustration of a protecting layer 40, an insulating layer 41, and a wire protecting layer 43 illustrated in FIGS. 5 and 6.

As illustrated in FIGS. 3-6, the piezoelectric elements 31 are arranged on the upper surface of the vibration layer 30 so as to overlap the respective pressure chambers 26. That is, the piezoelectric elements 31 are arranged in the conveying direction so as to correspond to the arrangement of the pressure chambers 26. As a result, in accordance with the arrangement of the nozzles 24 and the pressure chambers 26, the piezoelectric elements 31 constitute the eight piezoelectric element rows 38, each two of which correspond to one of the four ink colors. It is noted that a group of the piezoelectric elements 31 of the two piezoelectric element rows 38 corresponding to each of the four ink colors will be referred to as "piezoelectric element group 39". As illustrated in FIG. 3, the four piezoelectric element groups 39k, 39y, 39c, 39m respectively corresponding to the four ink colors are arranged in the scanning direction.

Each of the piezoelectric elements 31 includes a first electrode 32, a piezoelectric layer 33, and a second electrode 34 disposed in this order from a lower side over the vibration layer 30.

Figure 5:
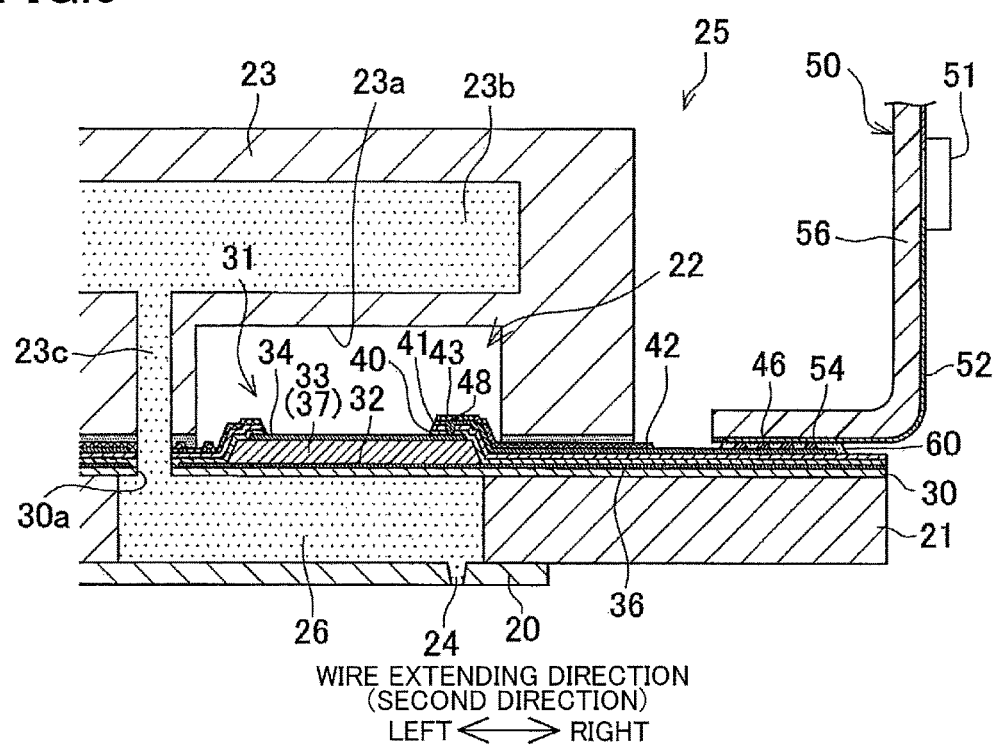
FIG. 5 is a cross-sectional view taken along line V-V in FIG. 4.
Figure 6:
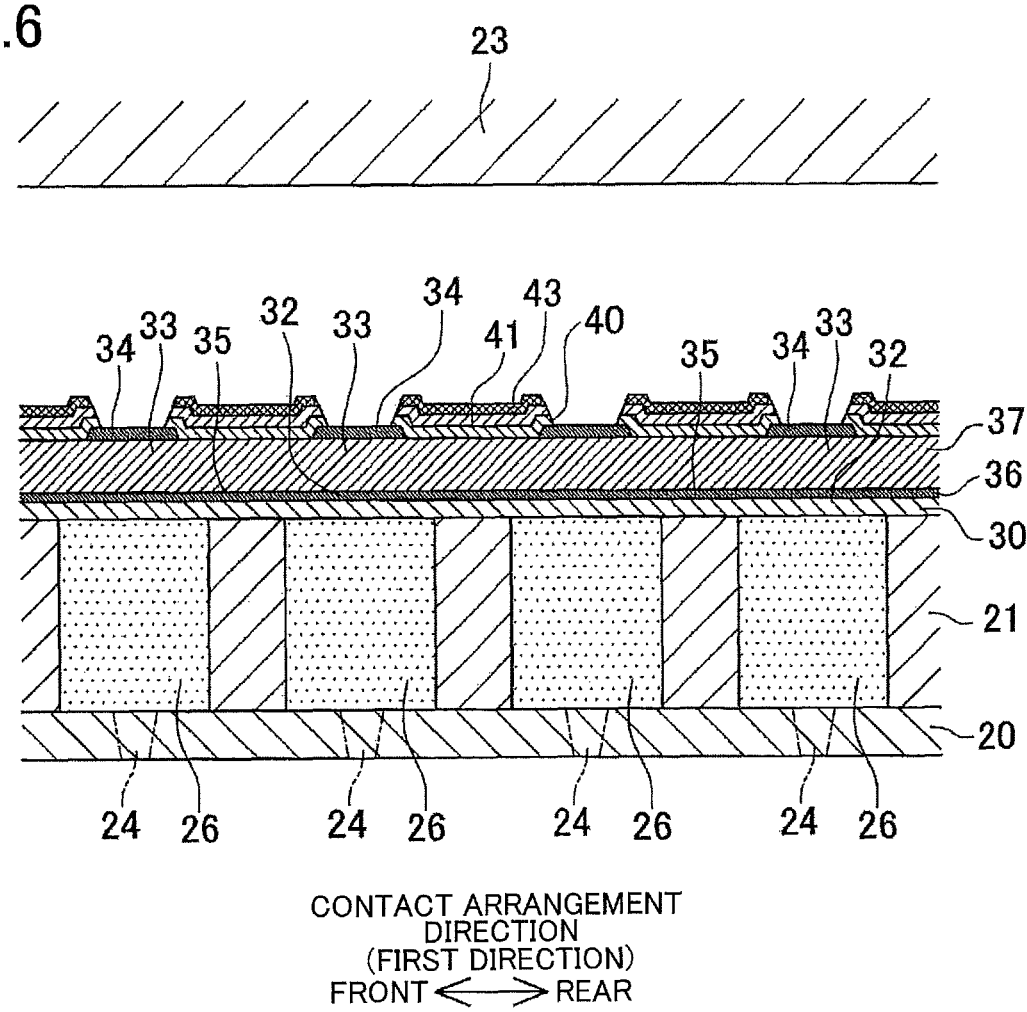
FIG. 6 is a cross-sectional view taken along line VI-VI in FIG. 4.

As illustrated in FIGS. 5 and 6, the first electrode 32 is formed at an area opposed to the pressure chamber 26 formed in the vibration layer 30. As illustrated in FIG. 6, each adjacent two of the first electrodes 32 of the respective piezoelectric elements 31 are connected to each other by an electrically conductive portion 35 disposed between the piezoelectric elements 31. In other words, the first electrodes 32 and the electrically conductive portions 35 connecting the first electrodes 32 to each other constitute a common electrode 36 that covers substantially the entire upper surface of the vibration layer 30. The common electrode 36 is formed of platinum (Pt), for example. The thickness of the common electrode 36 is 0.1 μm, for example. It is noted that the wording "conduct" and "conductive" in the present specification principally means "electrically conduct" and "electrically conductive".

The piezoelectric layer 33 is formed of a piezoelectric material such as lead zirconate titanate (PZT), for example. The piezoelectric layer 33 may be formed of a non-lead piezoelectric material not containing lead. The thickness of the piezoelectric layer 33 is ranged between 1.0 μm and 2.0 μm, for example.

As illustrated in FIGS. 3, 4, and 6, in the present embodiment, the piezoelectric layers 33 of the respective piezoelectric elements 31 are connected to each other in the conveying direction to form a rectangular piezoelectric member 37 elongated in the conveying direction. That is, the eight piezoelectric members 37 constituted by the piezoelectric layers 33 respectively corresponding to the eight pressure chamber rows are disposed on the common electrode 36 covering the vibration layer 30.

The second electrodes 34 are disposed on upper surfaces of the respective piezoelectric layers 33. Each of the second electrodes 34 has a rectangular shape in plan view which is one size smaller than each of the pressure chambers 26. The second electrodes 34 respectively overlap central portions of the respective pressure chambers 26. Unlike the first electrodes 32, the second electrodes 34 of the respective piezoelectric elements 31 are separated and spaced apart from each other. That is, the second electrodes 34 are individual electrodes provided for individually for the respective piezoelectric elements 31. The second electrodes 34 are formed of iridium (Ir) or platinum (Pt), for example. The thickness of each of the second electrodes 34 is 0.1 μm, for example.

As illustrated in FIGS. 5 and 6, the piezoelectric actuator 22 includes the protecting layer 40, the insulating layer 41, wires 42, and the wire protecting layer 43.

As illustrated in FIG. 5, the protecting layer 40 is disposed so as to cover a surface of the piezoelectric member 37 except central portions of the respective second electrodes 34. One of main purposes of the protecting layer 40 is preventing ingress of water from air into the piezoelectric layers 33. The protecting layer 40 is formed of a material having low permeability such as oxides and nitrides, for example. Examples of the oxides include alumina (Al2O3), silicon oxide (SiOx), and tantalum oxide (TaOx). Examples of the nitrides include silicon nitride (SiN).

The insulating layer 41 is formed on an upper side of the protecting layer 40. A material of the insulating layer 41 is not limited in particular. For example, the insulating layer 41 is formed of silicon dioxide (SiO2). This insulating layer 41 is provided for increasing insulation between the common electrode 36 and the wires 42 connected to the respective second electrodes 34.

The wires 42 are formed on the insulating layer 41. The wires 42 are drawn out from the respective second electrodes 34 of the piezoelectric elements 31. Each of the wires 42 is formed of aluminum (Al), for example. As illustrated in FIG. 5, one end portion of each of the wires 42 is disposed so as to overlap an end portion of the second electrode 34 disposed on a corresponding one of the piezoelectric layers 33. Each of the wires 42 is conductive with the corresponding second electrode 34 by a through electrically-conductive portion 48 that extends through the protecting layer 40 and the insulating layer 41.

Each of the wires 42 corresponding to the respective piezoelectric elements 31 extends rightward or leftward. That is, the direction in which the wires 42 extend (hereinafter referred to as "wire extending direction") is orthogonal to the nozzle arrangement direction. Specifically, as illustrated in FIG. 3, the wires 42 extend rightward from the respective piezoelectric elements 31 constituting the right two piezoelectric element groups 39k, 39y of the four piezoelectric element groups 39, and the wires 42 extend leftward from the respective piezoelectric elements 31 constituting the left two piezoelectric element groups 39c, 39m of the four piezoelectric element groups 39.

Each of the driving contacts 46 is provided on an end portion of a corresponding one of the wires 42, which end portion is located on an opposite side of the wire 42 from its portion on which the second electrode 34 is disposed. The driving contacts 46 are arranged in a row in the conveying direction at each of a right end portion and a left end portion of the piezoelectric actuator 22. That is, the direction in which the driving contacts 46 are arranged (hereinafter may be referred to as "contact arrangement direction") is parallel with the nozzle arrangement direction. In the present embodiment, the nozzles 24 forming the nozzle group 27 of each color are arranged at intervals of 600 dpi (=42 μm). Also, each of the wires 42 extends rightward or leftward from the piezoelectric element 31 corresponding to the nozzle groups 27 associated with corresponding two colors. Accordingly, at each of the right end portion and the left end portion of the piezoelectric actuator 22, the driving contacts 46 are arranged at very short intervals of a half of those of the nozzles 24 of each nozzle group 27, that is, the driving contacts 46 are arranged at the intervals of about 21 μm.

The two ground contacts 47 are respectively disposed in front of and at a rear of the driving contacts 46 arranged in a row in the front and rear direction. Each of the ground contacts 47 has a larger contacting area than each of the driving contacts 46. Each of the ground contacts 47 is connected to the common electrode 36 via a corresponding one of conductive portions 49 (see FIG. 10) which extends through the protecting layer 40 and the insulating layer 41 located just under the ground contact 47.

The driving contacts 46 and the ground contacts 47 disposed on the right end portion and the left end portion of the piezoelectric actuator 22 are exposed from the protector 23. The two COFs 50 are respectively joined to the right end portion and the left end portion of the piezoelectric actuator 22. Each of the driving contacts 46 is connected to a corresponding one of the driver ICs 51 via a corresponding one of the individual contacts 54 and a corresponding one of the individual wires 52 of the COFs 50. A drive signal is supplied from the driver IC 51 to the driving contacts 46. Each of the ground contacts 47 is connected to a corresponding one of the ground connection contacts 55 of the COFs 50. Detailed constructions of the driving contacts 46 and the ground contacts 47 of the piezoelectric actuator 22 and electric connection between each of the contacts 46, 47 and a corresponding one of the contacts 54, 55 disposed on the COFs 50 will be explained later.

As illustrated in FIG. 5, the wire protecting layer 43 is disposed so as to cover the wires 42. The wire protecting layer 43 increases insulation between the wires 42. Also, the wire protecting layer 43 inhibits oxidation of a material, e.g., Al, of the wires 42. The wire protecting layer 43 is formed of silicon nitride (SiNx), for example.

As illustrated in FIGS. 5 and 6, in the present embodiment, each of the second electrodes 34 is exposed from the protecting layer 40, the insulating layer 41, and the wire protecting layer 43 except its peripheral portion. That is, deformation of the piezoelectric layers 33 is not hindered by the protecting layer 40, the insulating layer 41, and the wire protecting layer 43.

Joint Portions of Piezoelectric Actuator and COF

There will be next explained a detailed construction of the joint portions of the piezoelectric actuator 22 and each of the COFs 50 with reference to FIGS. 5 and 7-10B.

As described above, the driving contacts 46 and the two ground contacts 47 are provided at each of the right and left end portions of the piezoelectric actuator 22. The driving contacts 46 are arranged in the front and rear direction. The two ground contacts 47 are disposed respectively on opposite sides of the driving contacts 46 in the front and rear direction. As illustrated in FIG. 4, the individual contacts 54 and the two ground connection contacts 55 are provided at the end portion of each of the COFs 50 which is joined to the piezoelectric actuator 22. The individual contacts 54 are arranged in the front and rear direction. The two ground connection contacts 55 are disposed respectively on opposite sides of the individual contacts 54 in the front and rear direction.

The end portions of the respective COFs 50 are joined to the piezoelectric actuator 22 with non-conductive thermosetting adhesive 60 formed of epoxy resin, for example. The adhesive 60 is generally used in the form of a film or a paste. One example of the film is a non-conductive film (NCF). One example of the paste is a non-conductive paste (NCP). It is noted that the following description will be provided for one of the COFs 50 for simplicity, unless otherwise required.

The COF 50 is pressed against the piezoelectric actuator 22 while heating the adhesive 60 in the state in which the adhesive 60 is provided between each of the contacts 46, 47 disposed on the piezoelectric actuator 22 and a corresponding one of the contacts 54, 55 disposed on the COF 50. This operation hardens the adhesive 60 in a state in which the driving contacts 46 and the individual contacts 54 are respectively in contact with each other, and the two ground contacts 47 and the two ground connection contacts 55 are respectively in contact with each other. This results in electric connection between each of the contacts 46, 47 disposed on the piezoelectric actuator 22 and the corresponding one of the contacts 54, 55 disposed on the COF 50.

The ground contacts 47 and the ground connection contacts 55 conduct with the common electrode 36 for the piezoelectric elements 31. When a plurality of the piezoelectric elements 31 are driven at the same time, a large current may temporarily pass in the common electrode 36. In this case, a difference in length among paths connected to the common electrode 36 increases a difference in drop of voltage in paths extending from the ground contacts 47 to the common electrode 36 among the piezoelectric elements 31, resulting in increase in difference in amount of displacement among the piezoelectric elements 31. To suppress this phenomenon, it is preferable to reduce the resistance between each of the ground contacts 47 and the corresponding ground connection contact 55 during connection therebetween and to make the resistance of the path connected to the common electrode 36 as small as possible. From this viewpoint, as illustrated in FIGS. 4 and 9, the contacting area of each of the ground contacts 47 is larger than that of each of the driving contacts 46. That is, the length L0 of the ground contact 47 in the right and left direction is greater than the length (L1, L2) of each of the driving contacts 46 in the right and left direction, and the width W0 of the ground contact 47 in the front and rear direction is greater than the width (W1, W2) of each of the driving contacts 46 in the front and rear direction. The contacting area of the ground connection contact 55 disposed on the COF 50 is also greater than that of each of the individual contacts 54.

In the present embodiment, to increase a force joining between the contacts due to the adhesive 60, protruding and recessed portions 70 are provided on surfaces of the respective driving contacts 46 connected to the piezoelectric actuator 22, and protruding and recessed portions 71 are provided on surfaces of the respective ground contacts 47 connected to the piezoelectric actuator 22.

First, the protruding and recessed portions 70 of the respective driving contacts 46 will be described. As illustrated in FIGS. 7-10B, each of the driving contacts 46 includes: a base layer 58 provided on a distal end portion of one of the wires 42 which is connected to a corresponding one of the second electrodes 34; and four protrusions 63 disposed on the base layer 58. The four protrusions 63 are arranged in a row and spaced apart from each other in the right and left direction orthogonal to the direction in which the driving contacts 46 are arranged. Recesses 64 are formed each between corresponding adjacent two of the protrusions 63 in the right and left direction. That is, each of the driving contacts 46 has the protruding and recessed portion 70 constituted by the four protrusions 63 and the three recesses 64.

Figure 10A:
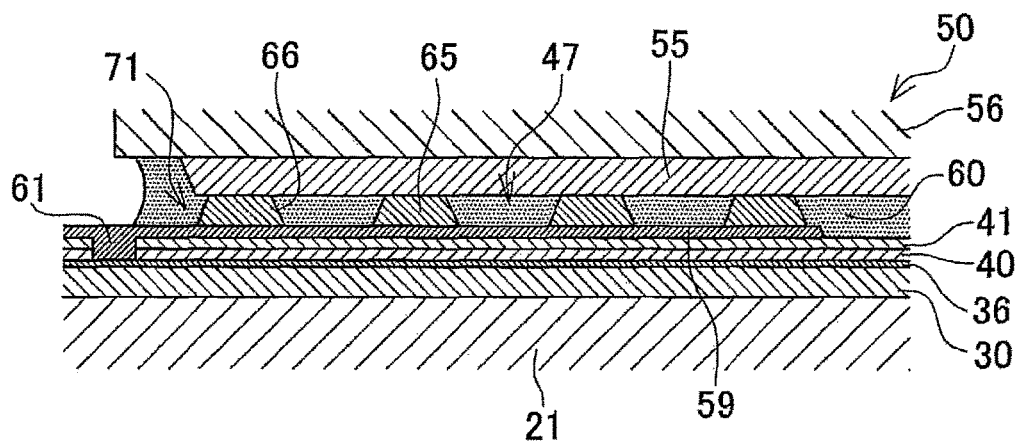
FIG. 10A is a cross-sectional view taken along line Xa-Xa in FIG. 9.

Like the driving contacts 46, each of the ground contacts 47 has the protruding and recessed portion 71. As illustrated in FIGS. 9 and 10A, the ground contact 47 includes: a base layer 59 formed on the insulating layer 41 like the wires 42; and four protrusions 65 disposed on the base layer 59. The base layer 59 conducts with the common electrode 36 via a through electrically-conductive portion 61 extending through the protecting layer 40 and the insulating layer 41 located under the base layer 59. The four protrusions 65 are arranged in a row and spaced apart from each other in the right and left direction. Recesses 66 are formed each between corresponding adjacent two of the protrusions 65 in the right and left direction. That is, each of the driving contacts 47 has the protruding and recessed portion 71 constituted by the four protrusions 65 and the three recesses 66.

Figure 8:
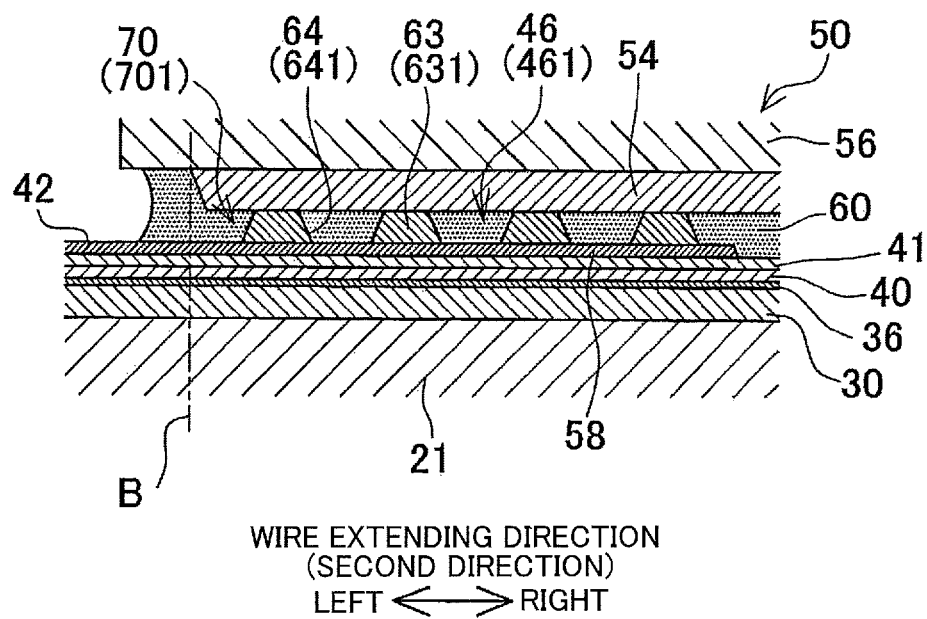
FIG. 8 is a cross-sectional view taken along line VIII-VIII in FIG. 7.
Figure 10B:
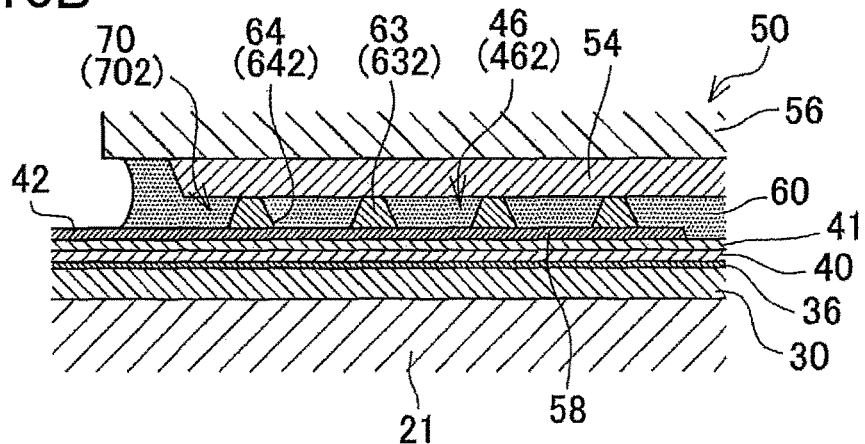
FIG. 10B is a cross-sectional view taken along line Xb-Xb in FIG. 9.
Figure 11A:
FIGS. 11A through 11F are views illustrating a first part of a process of producing the ink-jet head.
Figure 11B:
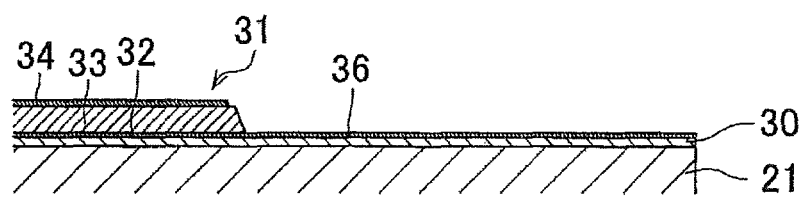
Figure 11C:
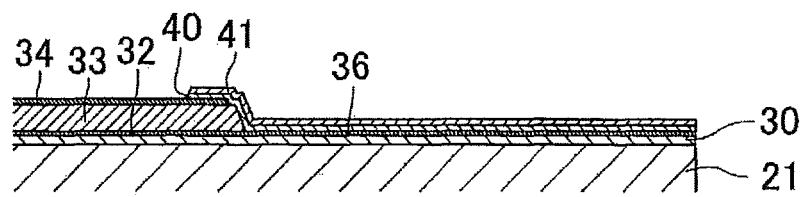
Figure 11D:
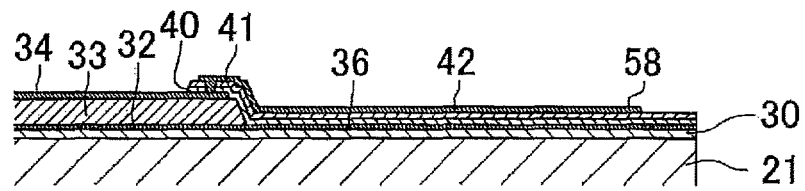
Figure 11E:
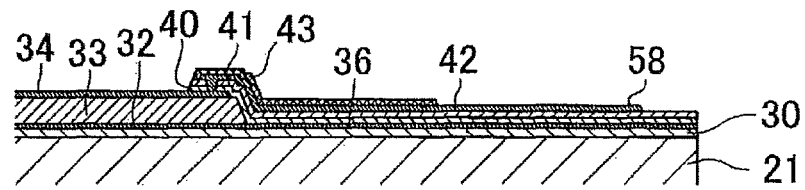
Figure 11F:
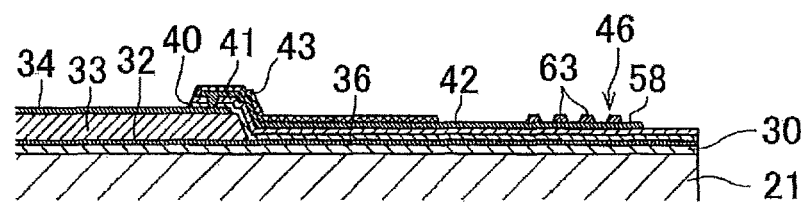
Figure 12G:
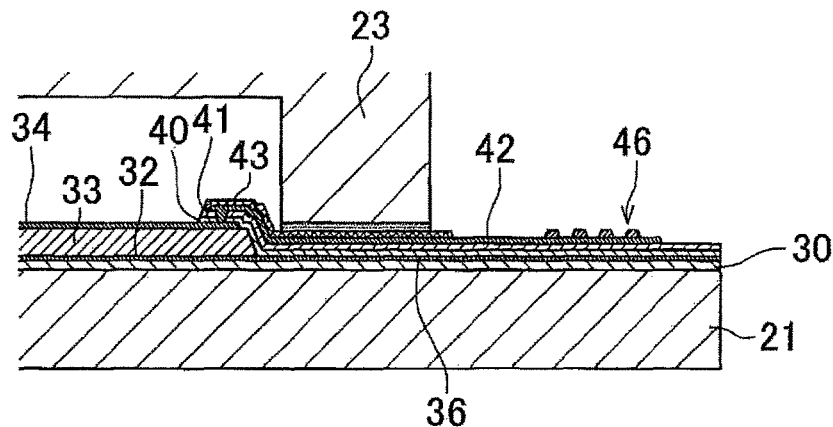
FIGS. 12G through 12I are views illustrating a latter part of the process of producing the ink-jet head.
Figure 12H:
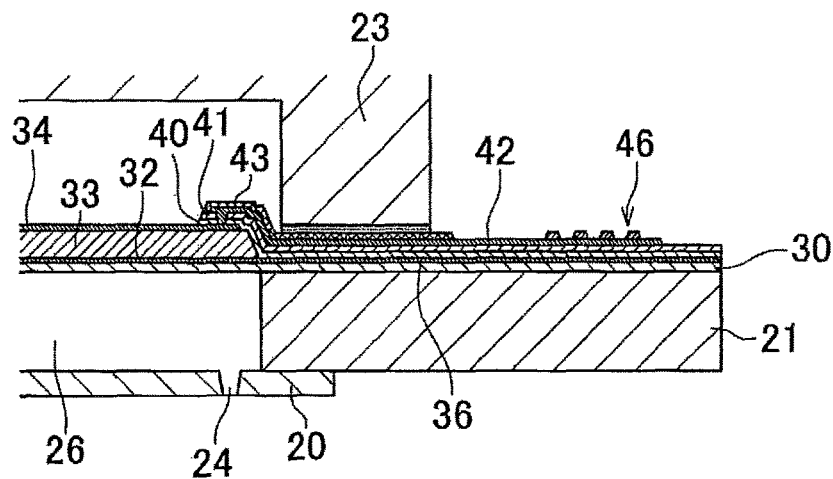
Figure 12I:
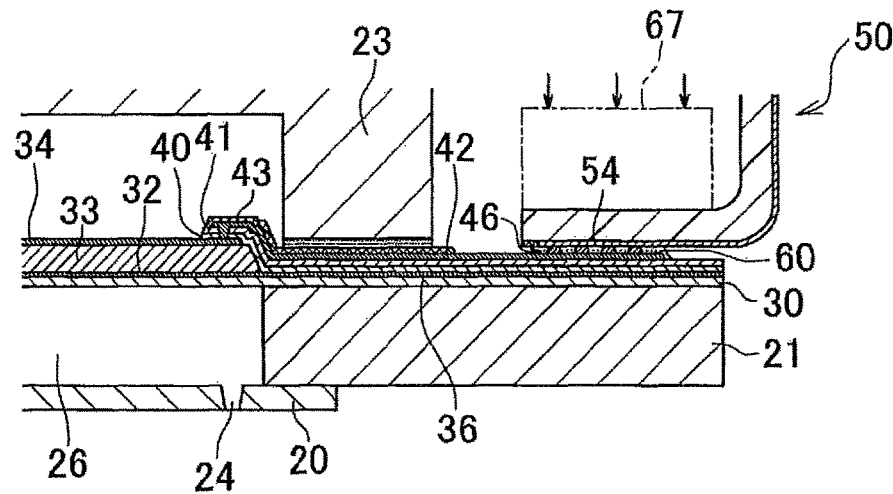

In the construction in which the protruding and recessed portion 70 is formed in the driving contact 46, when the driving contact 46 and the individual contact 54 disposed on the COF 50 are joined to each other with the adhesive 60, the adhesive 60 is hardened in a state in which the recesses 64 are filled with the adhesive 60 as illustrated in FIGS. 8 and 10A. This construction increases the joining force between the driving contact 46 and the individual contact 54. Like the driving contact 46, the recesses 66 of the ground contact 47 are filled with the adhesive 60 as illustrated in FIG. 10B, resulting in increase in the joint force between the ground contact 47 and the ground connection contact 55 disposed on the COF 50.

In the present embodiment, the base layer 58 of the driving contact 46 and the base layer 59 of the ground contact 47 are formed of the same material as used in the wires 42 such as aluminum (Al). The protrusions 63 of the driving contact 46 and the protrusions 65 of the ground contact 47 are formed of a material different from that of the wires 42 such as gold (Au). As will be described in explanation for a production process, the wires 42 and the base layers 58, 59 are formed in the same process, but the protrusions 63, 65 are formed in a process different from that for the wires 42.

In the case where the protrusions are formed together with other layers such as the wires 42, the heights of the protrusions are inevitably limited to a range of required thickness of the other layers. In the present embodiment, in contrast, it is possible to freely set the heights of the protrusions 63, 65 without the limitation of formation of the other layers. The increase in the heights of the protrusions 63, 65 enables the protrusions 63, 65 to be deeply pressed in the layer of the adhesive 60, so that a larger amount of the adhesive 60 adheres to the protrusions 63, 65, resulting in increase in the joining force.

Incidentally, the COF 50 bonded to the contacts 46, 47 arranged in the front and rear direction is contracted due to various causes, and this contraction applies a force to the joint portions between the contacts. As will be described in explanation for the production process, for example, the COF 50 is heated at its joining to harden the adhesive 60. In this heating of the COF 50, a large degree of thermal contraction is caused in the base 56 of the COF 50 constituted by a polyimide film, for example. Though in a small degree when compared with the production process, the base 56 of the COF 50 is also contracted in normal use of the printer and by changes in environmental temperature and environmental humidity around the ink-jet head 4. When the COF 50 is contracted, displacement due to the contraction is larger at its portion near the edge of the COF 50 than at its portion far from the edge. Accordingly, a larger force is applied to the joint portions located at the end portions of the COF 50 than to the joint portions located at the central portion of the COF 50.

To increase the joining force of the joint portions located at the end regions in the front and rear direction, the printer 1 in the present embodiment is configured such that the shape of the protruding and recessed portion is different between (i) the contacts located at the central region and (ii) the contacts located at the end regions among the contacts 46, 47 arranged in the front and rear direction. Specifically, the area of each recess is larger in the contacts located at the end regions than in the contacts located at the central region. The area of the adhesive 60 adhering to the contact increases with increase in the area of the recess, resulting in increase in the joining force.

First, the shape of the protruding and recessed portion 70 is different between (i) the driving contacts 46 disposed at the central region in the front and rear direction and (ii) the driving contacts 46 disposed at the end regions in the front and rear direction among the plurality of driving contacts 46. In the following explanation, in the case where the driving contacts 46 located at the central region and the driving contacts 46 located at the end regions are distinguished from each other, the driving contacts 46 disposed at the central region will be referred to as "driving contacts 461", and the driving contacts 46 disposed at the end regions as "driving contacts 462".

Figure 7:
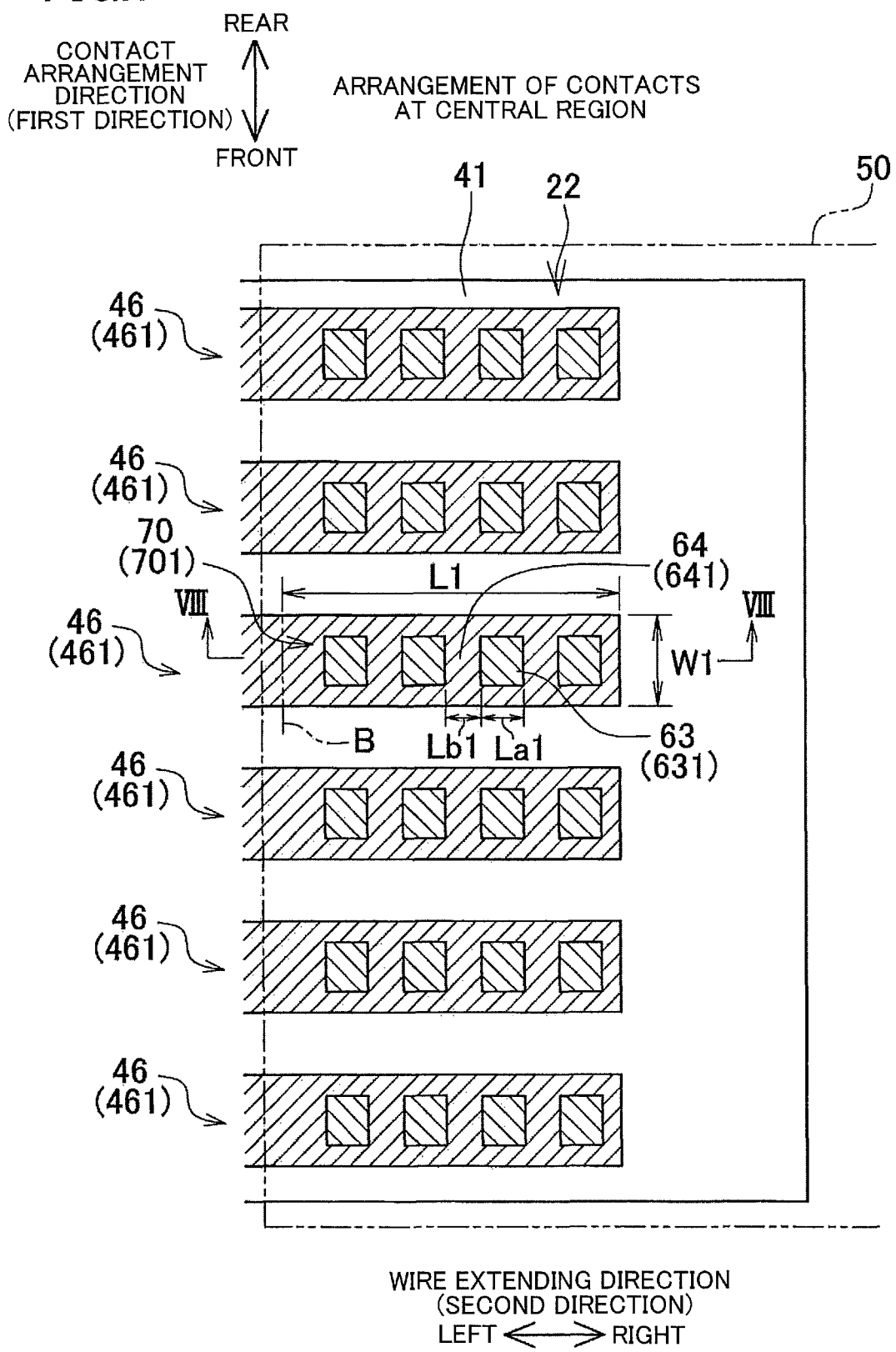
FIG. 7 is a plan view of driving contacts disposed at an area B1 in FIG. 2.

In the driving contacts 461 disposed at the central region, as illustrated in FIG. 7, the length of each of protrusions 631 in the right and left direction is defined as La1, and the length of each of recesses 641 in the right and left direction, i.e., each of the pitches of the protrusions 631, is defined as Lb1. In the driving contacts 462 disposed at the end regions, as illustrated in FIG. 9, the length of each of protrusions 632 in the right and left direction is defined as La2, and the length of each of recesses 642 in the right and left direction is defined as Lb2. The length Lb2 of the recess 642 at the end region is greater than the length Lb1 of the recess 641 at the central region. It is noted that the width of the protrusion 631 in the front and rear direction is equal to that of the protrusion 632 in the front and rear direction, and the width of the recess 641 in the front and rear direction is equal to that of the recess 642 in the front and rear direction. As a result, the area of each of the recesses 642 of the driving contacts 462 disposed at the end regions is greater than that of each of the recesses 641 of the driving contacts 461 disposed at the central region.

The length La1 of the protrusion 631 is equal to the length La2 of the protrusion 632. That is, the area of an upper surface of the protrusion 631 is equal to that of an upper surface of the protrusion 632. If the area of the upper surface is different among the protrusions 63, resistance between the driving contact 46 and the individual contact 54 during their connection is also different. If the resistance is different among the piezoelectric elements 31, waveforms of the drive signals applied to each of the second electrodes 34 change depending upon the resistance, leading to different driving characteristics among the piezoelectric elements 31. From this viewpoint, the area of the protrusion 63 is preferably the same between (i) the driving contacts 461 disposed at the central region and (ii) the driving contacts 462 disposed at the end regions.

While the length of the recess 642 in the right and left direction is greater than that of the recess 641 in the right and left direction, the lengths of the respective protrusions 63 in the right and left direction are the same as each other. Thus, the length L2 of each of the driving contacts 462 disposed at the end regions is greater in the right and left direction than the length L1 of each of the driving contacts 461 disposed at the central region. It is noted that since each of the wires 42 and the base layer 58 of the corresponding driving contact 46 are formed integrally with each other in the present embodiment, a boundary between the base layer 58 and the wire 42 needs to be determined to determine the length of each driving contact 46. Here, as illustrated in FIG. 8, an end of the individual contact 54 of the COF 50 is defined as a boundary B between the driving contact 46 and the wire 42. That is, a portion located to the right of the left end of the individual contact 54 in FIG. 8 is the driving contact 46.

The width W1 of each of the driving contacts 461 disposed at the central region in the front and rear direction is equal to the width W2 of each of the driving contacts 462 disposed at the end regions in the front and rear direction.

Furthermore, in the present embodiment, the shape of the protruding and recessed portion is different between (i) the driving contacts 46 and (ii) the ground contacts 47 located on outer sides of the driving contacts 46 in the front and rear direction.

As illustrated in FIGS. 9-10B, the length Lb0 of each of the recesses 66 of the ground contacts 47 in the right and left direction is greater than the length (Lb1, Lb2) of each of the recesses 64 of the driving contacts 46 in the right and left direction. The width of each of the recesses 66 of the ground contacts 47 in the front and rear direction is greater than that of each of the recesses 64 of the driving contacts 46 in the front and rear direction. Accordingly, the area of each of the recesses 66 of the ground contacts 47 is greater than that of each of the recesses 64 of the driving contacts 46.

The length La0 of each of the protrusions 65 of the ground contacts 47 in the right and left direction is also greater than the length (La1, La2) of each of the protrusions 63 of the driving contacts 46 in the right and left direction. That is, the area of an upper surface of each of the protrusions 65 of the ground contacts 47 is greater than that of an upper surface of each of the protrusions 63 of the driving contacts 46. This construction reduces the resistance between the ground contact 47 and the ground connection contact 55 during connection therebetween, resulting in reduced resistance of the paths connected to the common electrode 36.

There will be next explained the process of producing the ink-jet head 4 with reference to FIGS. 11A-12I. The following steps A-I respectively correspond to FIGS. 11A-12I.

In step A, the vibration layer 30 is formed by performing an oxidation processing or a nitriding processing on a surface of a silicon single crystal base that is to become the passage definer 21. In step B, the first electrodes 32 (the common electrode 36), the piezoelectric layers 33, and the second electrodes 34 are formed on the vibration layer 30 by deposition and etching to form the piezoelectric elements 31. In step C, the protecting layer 40 and the insulating layer 41 are formed so as to cover the piezoelectric layers 33, and patterning is performed by etching.

In step D, the wires 42 formed of, e.g., aluminum (Al) are formed on the insulating layer 41. Specifically, step D is performed by forming an Al layer on the insulating layer 41 and then patterning and etching this Al layer. In the patterning, the base layers 58 of the respective driving contacts 46 are formed with the wires 42. Though not illustrated in FIG. 11D, the base layers 59 of the respective ground contacts 47 (see FIGS. 9 and 10A) are also formed. In step E, the wire protecting layer 43 is formed on the wires 42 and patterned. In step F, the protrusions 63 formed of gold (Au) are formed on the base layer 58 by plating. Though not illustrated in FIG. 11F, the protrusions 65 formed of gold (Au) are formed on the base layer 59 by plating. As a result, the driving contacts 46 each having the protrusions 63 and the recesses 64 and the ground contacts 47 each having the protrusions 65 and the recesses 66 (see FIGS. 9-10B) are formed.

In step G, the protector 23 is joined to the piezoelectric actuator 22 so as to cover the piezoelectric elements 31. In step H, the passage definer 21 is ground to reduce its thickness to an appropriate thickness, and then the pressure chambers 26 are formed by etching.

In step I, the COF 50 is joined with the adhesive 60 to the end portion of the piezoelectric actuator 22 on which the driving contacts 46 and the ground contacts 47 are disposed. Specifically, the adhesive 60 (NCF or NCP) is provided between the piezoelectric actuator 22 and the COF 50. Also, the actuator 22 and the COF 50 are positioned with respect to each other on the end portion of the piezoelectric actuator 22 at the central portion thereof in the front and rear direction. In this state, the COF 50 is pressed against the adhesive 60 using a heater plate 67 placed on an upper surface of the COF 50.

When the COF 50 is pressed by the heater plate 67, the adhesive 60 is compressed while heated between (i) the contacts 46, 47 disposed on the piezoelectric actuator 22 and (ii) the respective contacts 54, 55 disposed on the COF 50. As a result, as illustrated in FIGS. 8, 10A, and 10B, the adhesive 60 flows outward, and each of the protrusions 63, 65 of the contacts 46, 47 disposed on the piezoelectric actuator 22 contacts a corresponding one of the contacts 54, 55 disposed on the COF 50. During this operation, the adhesive 60 partly enters the recesses 64, 66. The adhesive 60 is hardened in this state, so that the COF 50 is mechanically joined to the piezoelectric actuator 22 in a state in which the contacts 46, 47 disposed on the piezoelectric actuator 22 and the respective contacts 54, 55 disposed on the COF 50 conduct with each other.

Here, in the present embodiment, the shape of the protruding and recessed portion is different between (i) the contacts disposed at the central region and (ii) the contacts disposed at the end regions among the contacts 46, 47 arranged in the front and rear direction. Specifically, as illustrated in FIGS. 7-10B, the area of each of the recesses 642 of the driving contacts 462 disposed at the end regions among the driving contacts 46 is greater than the area of each of the recesses 641 of the driving contacts 461 disposed at the central region among the driving contacts 46. Also, the area of each of the recesses 66 of the ground contacts 47 located on outer sides of the driving contacts 46 is greater than the area of each of the recesses 64 of the driving contacts 46. Thus, each of the recesses of the contacts disposed at the end regions in the front and rear direction is large, resulting in increase in the joining force when the adhesive 60 has flowed into the recesses. This increased joining force prevents separation and positional misalignment of the COF 50 at its end portion to which a large force is easily applied in particular, when the COF 50 is contracted due to heat during joining.

In the present embodiment, in particular, the contacts 46, 47 disposed on the piezoelectric actuator 22 and the contacts 54, 55 disposed on the COF 50 are respectively joined to each other with the non-conductive adhesive 60. In the joining using the non-conductive adhesive, the contacts 46, 47 disposed on the piezoelectric actuator 22 and the contacts 54, 55 disposed on the COF 50 need to be reliably held in contact with each other, respectively. That is, separation of the COF 50 causes connection failure. From this viewpoint, the protruding and recessed portion that increases the joining force between the contacts is preferably employed for the end portions at which separation is easily caused in particular.

As illustrated in FIGS. 8 and 10, the protrusions 63 of each contact 46 are arranged in the right and left direction orthogonal to the contact arrangement direction, and the protrusions 65 of each contact 47 are also arranged in the right and left direction. This construction can reduce the width of each of the contacts 46, 47 in the contact arrangement direction even in the construction in which the protrusions 63 are provided on each of the contacts 46, and the protrusions 65 are provided on each of the contacts 47. In particular, reduction in the width of each of the driving contacts 46 can reduce the pitches of the driving contacts 46.

In the above-described construction, in the case where the area of the recess 64 is made different between (i) the driving contacts 461 located at the central region in the front and rear direction and (ii) the driving contacts 462 located at the end regions in the front and rear direction, the length of the recess 64 in the right and left direction is preferably made different therebetween so as not to increase the width of the driving contact 46 in the front and rear direction. Furthermore, in the present embodiment, each of the driving contacts 461 disposed at the central region and each of the driving contacts 462 disposed at the end regions have the same width in the front and rear direction. This construction can reduce the width of each of all the driving contacts 46 and the pitches of the driving contacts 46 while increasing the area of each of the recesses 642 of the driving contacts 462 disposed at the end regions.

In the present embodiment, with increase in the length of each of the recesses 642 in the right and left direction in the driving contacts 462 disposed at the end regions, the length of each of the driving contacts 462 in the right and left direction is greater than that of each of the driving contacts 461 disposed at the central region. In other words, the length of each of the protrusions 63 in the right and left direction is the same between (i) the driving contacts 46 disposed at the central region and (ii) the driving contacts 46 disposed at the end regions. With this construction, as described above, a difference in resistance between each of the driving contacts 46 and the corresponding individual contact 54 disposed on the COF 50 during connection therebetween can be reduced among the piezoelectric elements 31.

The protruding and recessed portion may be provided for any of (i) the contacts 46, 47 disposed on the piezoelectric actuator 22 and (ii) the contacts 54, 55 disposed on the COF 50. In the present embodiment, in particular, each of the contacts 46, 47 disposed on the piezoelectric actuator 22 has the protruding and recessed portion. With this construction, the protruding and recessed portion can also be formed in a series of deposition and patterning for forming the piezoelectric actuator 22, facilitating formation of the protruding and recessed portion.

In the present embodiment, the driving contacts 46 associated with two of the nozzle groups 27 each having the nozzles 24 arranged at 600 dpi are arranged at very short pitches of 21 μm on each of the opposite end portions of the piezoelectric actuator 22. In accordance with this arrangement, the individual contacts 54 disposed on the COF 50 are arranged at the same pitches. Thus, formation of the protrusions on the driving contacts 46 or the individual contacts 54 requires patterning with higher precision than patterning of the contacts. At the current level of technology relating to patterning on the COF 50, however, it is difficult to perform patterning at pitches less than 21 μm. In contrast, since there is an established technique for patterning a silicon base at the above-described fine pitches, it is easier to form the protruding and recessed portion in each of the contacts 46, 47 disposed on the piezoelectric actuator 22.

In the embodiment described above, the ink-jet head 4 is one example of a liquid ejector. The piezoelectric actuator 22 is one example of an actuator. The front and rear direction, i.e., each of the nozzle arrangement direction and the contact arrangement direction is one example of a first direction. The right and left direction, i.e., the wire extending direction orthogonal to the contact arrangement direction and parallel with the upper surface of the piezoelectric actuator 22 on which the contacts 46 are disposed is one example of a second direction. The COF 50 is one example of a wire member. Each of the driving contacts 46 and the ground contacts 47 connected to the piezoelectric actuator 22 is one example of a first contact. Each of the driving contacts 46 is one example of an individual contact. Each of the ground connection contacts 55 is one example of a common-electrode contact. Each of the individual contacts 54 and the ground connection contacts 55 disposed on the COF 50 is one example of a second contact.

Association of a central-region contact and an end-region contact may be considered in the following two ways. Focusing on the driving contacts 46, each of the driving contacts 461 of the driving contacts 46 which are located at the central region in the front and rear direction is one example of the central-region contact, and each of the driving contacts 462 of the driving contacts 46 which are located at the end regions in the front and rear direction is one example of the end-region contact. Focusing on the relationship between the driving contacts 46 and the ground contacts 47, each of the driving contacts 46 including the driving contacts 461, 462 is one example of the central-region contact, and each of the ground contacts 47 located on an end-side of the driving contacts 46 is one example of the end-region contact. The central-region contact is further from the end of the COF or the end of the individual contact in the front and rear direction than the end-region contact.

While the embodiment has been described above, it is to be understood that the disclosure is not limited to the details of the illustrated embodiment, but may be embodied with various changes and modifications, which may occur to those skilled in the art, without departing from the spirit and scope of the disclosure. There will be next explained modifications of the embodiment. It is noted that the same reference numerals as used in the above-described embodiment are used to designate the corresponding elements of the modifications, and an explanation of which is dispensed with.

While each of the driving contacts 46 and the ground contacts 47 of the piezoelectric actuator 22 has the protruding and recessed portion in the above-described embodiment, only each of the driving contacts 46 may have the protruding and recessed portion. Since each of the ground contacts 47 has a large contacting area, a large amount of the adhesive 60 is provided around the ground contacts 47, which may lead to a high joining force in some cases without the protruding and recessed portion. Also, since a plurality of the ground contacts 47 are provided, even in case where the COF 50 is separated from one of the ground contacts 47, a serious problem does not arise in driving the piezoelectric elements 31 if the other ground contact 47 conduct with the ground connection contact 55 disposed on the COF 50.

While the three insulating layers including the protecting layer 40, the insulating layer 41, and the wire protecting layer 43 are formed on the piezoelectric layers 33 in the above-described embodiment, these layers may be omitted as needed. For example, in the case where the wires connected to the second electrodes 34 are formed of a stable material such as gold (Au), the insulating layer 41 and the wire protecting layer 43 may be omitted.

The number of the protrusions and the number of the recesses provided for one contact are not limited in particular. However, the at least two protrusions need to be provided such that one recess is interposed between the at least two protrusions, in order to prevent the adhesive 60 from flowing out from the recess.

The shape of the protruding and recessed portion of each of the contacts 46, 47 is not limited to that in the embodiment. For example, the following construction may be employed.

Figure 13:
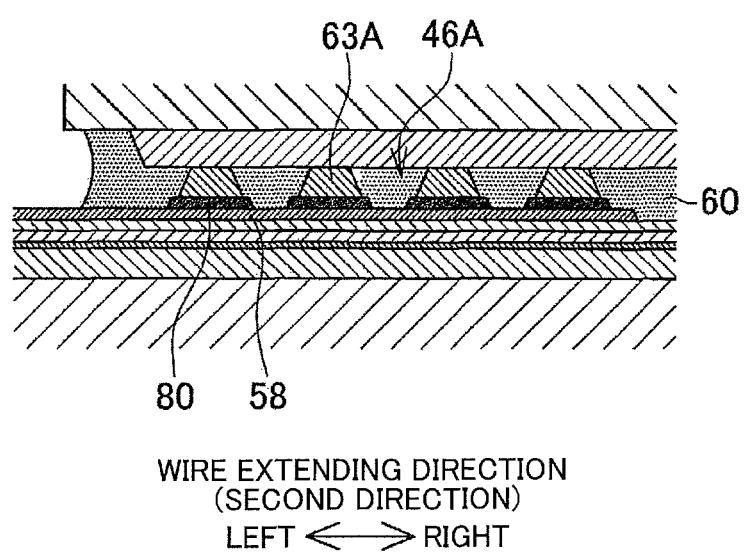
FIG. 13 is a cross-sectional view of joint portions of a piezoelectric actuator and a COF in a modification.

In a first example, as illustrated in FIG. 13, each of driving contacts 46A includes four intermediate layers 80 disposed on the base layer 58 so as to be spaced apart from each other. Four protrusions 63A are disposed on the respective four intermediate layers 80. With this construction, each of the intermediate layers 80 is interposed between the base layer 58 and a corresponding one of the respective protrusions 63A, resulting in increase in height of each protrusion 63A substantially. The increased height of the protrusion 63A enables the protrusion 63A to be deeply pressed into the adhesive 60, so that a larger amount of the adhesive 60 contacts a side surface of the protrusion 63A, resulting in increase in the joining force.

In the above-described embodiment, the protrusions 63 provided on the base layer 58 of the driving contact 46 are formed of a material different from that of the base layer 58. In a second example, in contrast, the protruding and recessed portion may be formed by etching an upper surface of the base layer 58, for example. In this construction, for example, at least two actuator protrusions extending in the contact arrangement direction (in the first direction) and at least one actuator recess extending in the contact arrangement direction are formed at a region at which the driving contact 46 is disposed, and the protruding and recessed portion is constituted by the at least two actuator protrusions and the actuator recesses interposed between the at least two actuator protrusions. In the case where the base layer 58 is thin, however, it is difficult to form a large protruding and recessed portion. In this case, the protruding and recessed portion may be formed on the contact by forming the protruding and recessed surface on another layer having a thickness greater than or equal to a particular thickness, which layer is located below the contact, and by arranging the contact on the protruding and recessed surface. With this construction, even in the case where the contact has a small thickness, it is possible to form a large protruding and recessed portion on the contact.

Figure 14A:
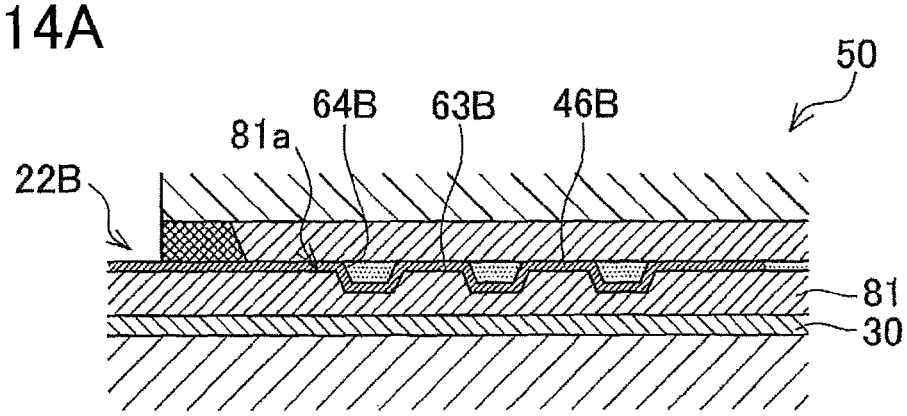
FIGS. 14A and 14B are cross-sectional views of joint portions of a piezoelectric actuator and a COF in another modification.

For example, in FIG. 14A, a piezoelectric portion (layer) 81 formed of the same material as used in the piezoelectric layer 33 of each piezoelectric element 31 (see FIGS. 5 and 6) is disposed on the vibration layer 30 so as to extend to a joined region of a piezoelectric actuator 22B which is joined to the COF 50. The piezoelectric portion 81 is formed together with the piezoelectric layer 33 of the piezoelectric element 31. The piezoelectric layer 33 needs to have some thickness to function the piezoelectric element 31. Thus, the piezoelectric portion 81 also has a thickness, e.g., 1 μm, greater than or equal to the particular thickness. Accordingly, it is possible to form a relatively large protruding and recessed surface 81a on the piezoelectric portion 81. Thus, the protruding and recessed surface 81a is formed by, e.g., etching on a portion of the piezoelectric portion 81 at the joined region, and a driving contact 46B is disposed so as to cover the protruding and recessed surface 81a. With this construction, the driving contact 46B has: protrusions 63B each extending in the contact arrangement direction as the actuator protrusions; and recesses 64B each extending in the contact arrangement direction as the actuator recesses.

Figure 14B:
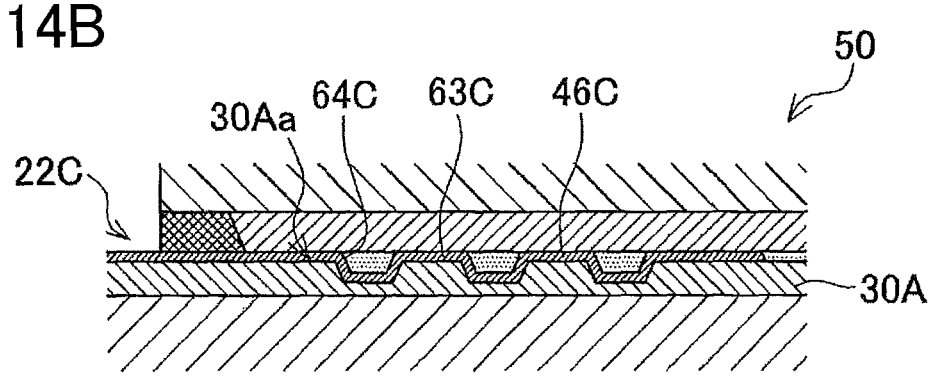

Also, a protruding and recessed surface is formed on the vibration layer on which the piezoelectric elements are disposed. In FIG. 14B, a vibration layer 30C extends to a joined region of a piezoelectric actuator 22C which is joined to the COF 50. The vibration layer 30C is bent by deformation of the piezoelectric elements and has some thickness of, e.g., 1 μm, so as to prevent the vibration layer 30C from being easily broken even when the bending is repeatedly performed. Accordingly, it is possible to form a relatively large protruding and recessed surface 30Aa on the vibration layer 30C. Thus, the protruding and recessed surface 30Aa is formed by etching on a portion of the vibration layer 30C at the joined region, and a driving contacts 46C is disposed so as to cover the protruding and recessed surface 30Aa. With this construction, the driving contact 46C has: protrusions 63C each extending in the contact arrangement direction as the actuator protrusions; and recesses 64C each extending in the contact arrangement direction as the actuator recesses.

In the above-described embodiment, as illustrated in FIGS. 7 and 9, the area of the protrusion 63 (the width thereof in the front and rear direction) is the same between (i) the driving contacts 461 disposed at the central region and (ii) the driving contacts 462 disposed at the end regions. In another modification, however, the area of the protrusion may vary for the following reason.

In the piezoelectric actuator having the piezoelectric elements 31, the resistance of the path connected to the common electrode 36 increases with increase in distance between the ground contact 47 and the first electrode 32 of the piezoelectric element 31, thereby increasing a drop of voltage in this path. This means that electric discharge characteristics during driving of the piezoelectric element 31 vary depending upon the distance between the piezoelectric element 31 and the ground contact 47, leading to a difference in characteristics among the piezoelectric elements 31. To solve this problem, a difference in resistance between paths connected to the common electrode 36 and causing the above-described difference in characteristics is adjusted by resistance of a path connected to the second electrode 34 as the individual electrode to reduce a difference in combined resistance between the entire paths connected to the piezoelectric elements 31. That is, the area of the protrusion is made different between the driving contacts connected to the second electrodes 34 for intentional differentiation in resistance among the paths connected to the second electrodes 34.

Specifically, in a contact having a long electric path to a corresponding one of the piezoelectric elements 31 and a corresponding one of the ground contacts 47 among a plurality of driving contacts 46D, the area of each protrusion is increased to reduce resistance of the path connected to the second electrode 34.

For example, as illustrated in FIGS. 2-4, in the case where the ground contacts 47 are located the respective end regions in the front and rear direction, an electric path extending from the piezoelectric element 31 corresponding to one of the driving contacts disposed at the central region to the ground contact 47 is longer than an electric path extending from the piezoelectric element 31 corresponding to one of the driving contacts disposed at the end regions to the ground contact 47. In this case, as illustrated in FIG. 15, the area of an upper surface of each of protrusions 631D of driving contacts 461D disposed at the central region is made greater than that of an upper surface of each of protrusions 632D of driving contacts 462D disposed at the end regions. It is noted that each of the driving contacts 462D disposed at the end regions is one example of a first individual contact, and each of the driving contacts 461D disposed at the central region is one example of a second individual contact.

Figure 16:
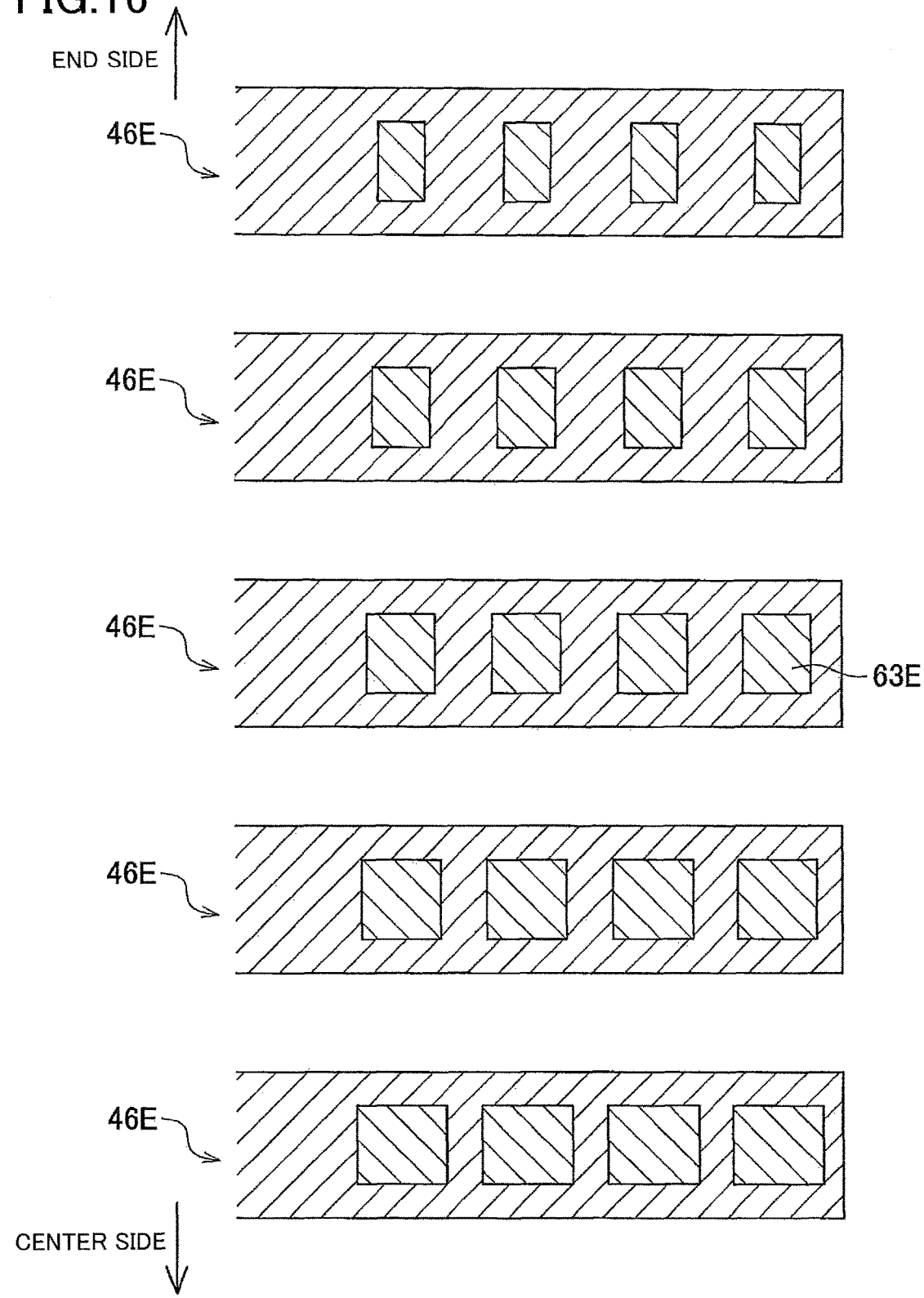
FIG. 16 is a plan view of driving contacts in yet another modification.

Alternatively, the area of the protrusion may increase with increase in the electric path. In FIG. 16, protrusions 63E are formed on a plurality of driving contacts 46E such that the area of an upper surface of a protrusion 63E increases with decrease in distance to the center of the COF 50 in the front and rear direction.

In the above-described embodiment, the length of the recess in the right and left direction is different between (i) the contacts disposed at the central region and (ii) the contacts disposed at the end regions. However, the width of the recess in the front and rear direction is different between (i) the contacts disposed at the central region and (ii) the contacts disposed at the end regions.

In FIG. 17, driving contacts 46F have protrusions 63F and recesses 64F, each extending across the entire width of a corresponding one of the driving contacts 46F in the front and rear direction. That is, each of the width of each protrusion 63F and the width of each recess 64F in the front and rear direction is equal to the width of each driving contact 46F in the front and rear direction. Also, the length of each of driving contacts 461F in the right and left direction at the central region and the length of each of driving contacts 462F in the right and left direction at the end regions are equal to each other. Likewise, the length of the protrusion 63F in the right and left direction is the same at the central region and at the end regions, and the length of the recess 64F in the right and left direction is the same at the central region and at the end regions. Furthermore, the width (=the contact width W2) of each of recesses 642F of the driving contacts 462F disposed at the end regions in the front and rear direction is greater than the width (=the contact width W1) of each of recesses 641F of the driving contacts 461F disposed at the central region in the front and rear direction.

In the driving contacts 462F disposed at the end regions, the increased width of each of the recesses 642F in the front and rear direction also increases the area of each of the recesses 642F, resulting in a larger joining force when the adhesive flows into the recesses 642F. Also, strength against a force in a direction in which the COF 50 is peeled is made higher by the increase in the length of the recess in the contact arrangement direction as in FIG. 17 than by the increase in the length of the recess in the right and left direction (the longitudinal direction of the contact) as in the embodiment.

Furthermore, in FIG. 17, the length of each protrusion 63F and the length of each recess 64F in the right and left direction are the same between (i) the driving contacts 462F disposed at the end regions and (ii) the driving contacts 461F disposed at the central region, and the positions of the protrusions 63F and the positions of the recesses 64F are the same between (i) the driving contacts 462F disposed at the end regions and (ii) the driving contacts 461F disposed at the central region. That is, a protruding and recessed pattern in the right and left direction is the same between (i) the driving contacts 462F disposed at the end regions and (ii) the driving contacts 461F disposed at the central region. This construction simplifies the entire pattern, thereby facilitating formation of the pattern by etching and/or plating and increasing accuracy of formation of the pattern. Furthermore, the length of the contact in the right and left direction is the same between (i) the driving contacts 462F disposed at the end regions and (ii) the driving contacts 461F disposed at the central region, further facilitating the patterning of the contacts.

FIG. 18 illustrates a modification of the construction in FIG. 17. In this modification, actuator protrusions 83 and actuator recesses 84 each continuously extending in the front and rear direction are formed on and in an end portion of a piezoelectric actuator 22G on which a plurality of driving contacts 46G (461G, 462G) are disposed. As in the constructions illustrated in FIGS. 14A and 14B, for example, the actuator protrusions 83 and the actuator recesses 84 may be formed by forming grooves elongated in the front and rear direction, in the piezoelectric layer or the vibration layer. The driving contacts 46G are formed on the actuator protrusions 83 and the actuator recesses 84, whereby protrusions 63G and recesses 64G are formed on and in each of the driving contacts 46G. In this modification, the protrusions 63G and the recesses 64G can be easily formed on and in each of the driving contacts 46G only by forming the actuator protrusions 83 and the actuator recesses 84 each extending continuously and then forming the driving contacts 46G on the actuator protrusions 83 and the actuator recesses 84. Furthermore, a protruding and recessed pattern can be formed with high accuracy when compared with the case where protrusions and recesses are formed for each of the contacts.

Figure 19:
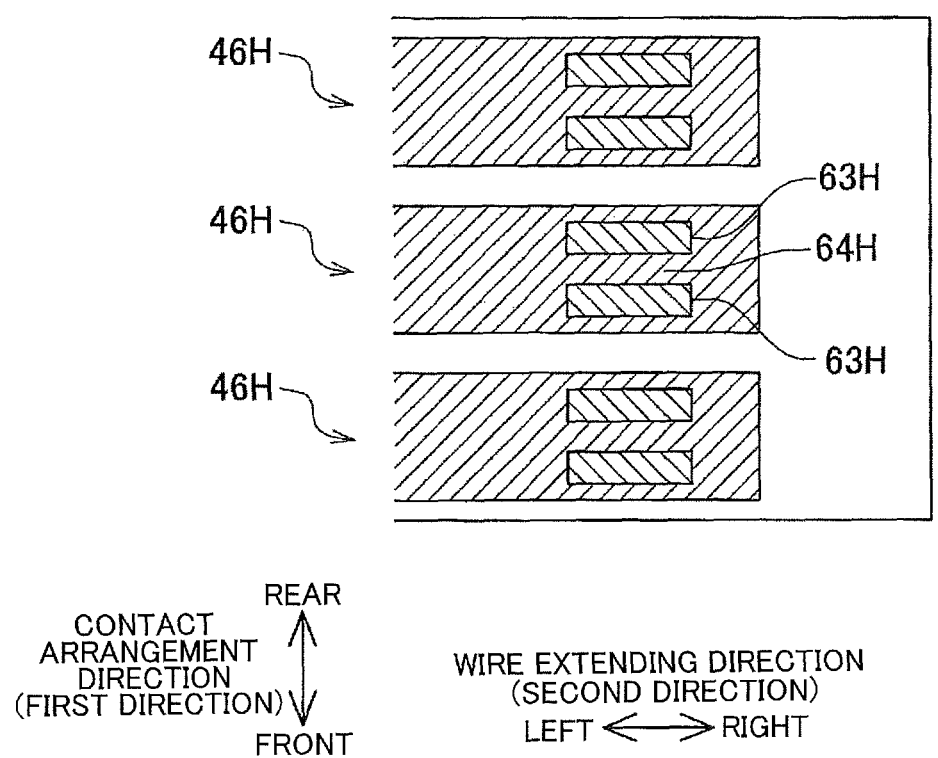
FIG. 19 is a plan view of driving contacts in yet another modification.

As illustrated in FIG. 19, a plurality of protrusions 63H may be arranged on each of driving contacts 46H in the front and rear direction as the contact arrangement direction. In this construction, the size of each protrusion 63H and/or the pitches of the protrusions 63H are made different between (i) the driving contacts 46H disposed at the end regions and (ii) the driving contacts 46H disposed at the central region to make the area of the recess different therebetween, for example. In this construction, however, each of the protrusions 63H and recesses 64H cannot have a large width in the right and left direction for preventing increase in the width of each contact. Thus, peel strength of the COF is lower in this construction than in the constructions in FIGS. 7 and 9 in the above-described embodiment and in the construction in FIG. 17.

As illustrated in FIG. 20, each of the number of protrusions 63I and the number of recesses 64I may be different between (i) driving contacts 462I of driving contacts 46I at the end regions and (ii) driving contacts 461I of the driving contacts 46I at the central region. In FIG. 20, even though the number of recesses 642I in each of the driving contacts 46I at the end regions is three and greater than the number (two) of recesses 641I in each of the driving contacts 46I at the central region, the total area of bottom surfaces of the recesses 64I are the same between the central region and the end regions. However, the larger number of the recesses 64I results in the adhesive also adhering to side surfaces of the protrusions 63I, which increases the contact area. Accordingly, the joining force increases with increase in the number of the recesses 64I.

The positions of the protrusions and the recesses may be different between (i) the contacts disposed at the end regions and (ii) the contacts disposed at the central region. For example, in FIG. 21, eight protrusions 63J having the same shape are formed in each of driving contacts 461J disposed at the central region and in each of driving contacts 462J disposed at the end regions. The eight protrusions 63J are arranged in two rows in the right and left direction. Six recesses 64J are formed each between corresponding two of the eight protrusions 63J in the right and left direction. On each of the driving contacts 461J disposed at the central region, the positions of the protrusions 63J in the right and left direction are the same between the two rows. On each of the driving contacts 462J disposed at the end regions, in contrast, the positions of the protrusions 63J in the right and left direction are displaced from each other between the two rows. As a result, the positions of the six recesses 64J are different between (i) the driving contacts 461J disposed at the central region and (ii) the driving contacts 462J disposed at the end regions.

In the above-described construction, the area and the number of the recesses 64J are the same between the central region and the end regions. However, the eight protrusions 63J are arranged in a staggered configuration at the end region, so that complicated-shaped spaces including the six recesses 64J are formed each between adjacent two of the eight protrusions 63J. The adhesive enters these spaces to increase the joining force.

In the above-described embodiment, as illustrated in FIGS. 2-4, the driving contacts 46 are arranged in the front and rear direction in the same orientation. In a piezoelectric actuator 22K in FIG. 22, in contrast, a plurality of driving contacts 46K fan out radially toward one side (a right side in FIG. 22) in the right and left direction. Likewise, a plurality of individual contacts 54K of a COF 50K fans out radially toward the one side in the right and left direction.

Figure 22:
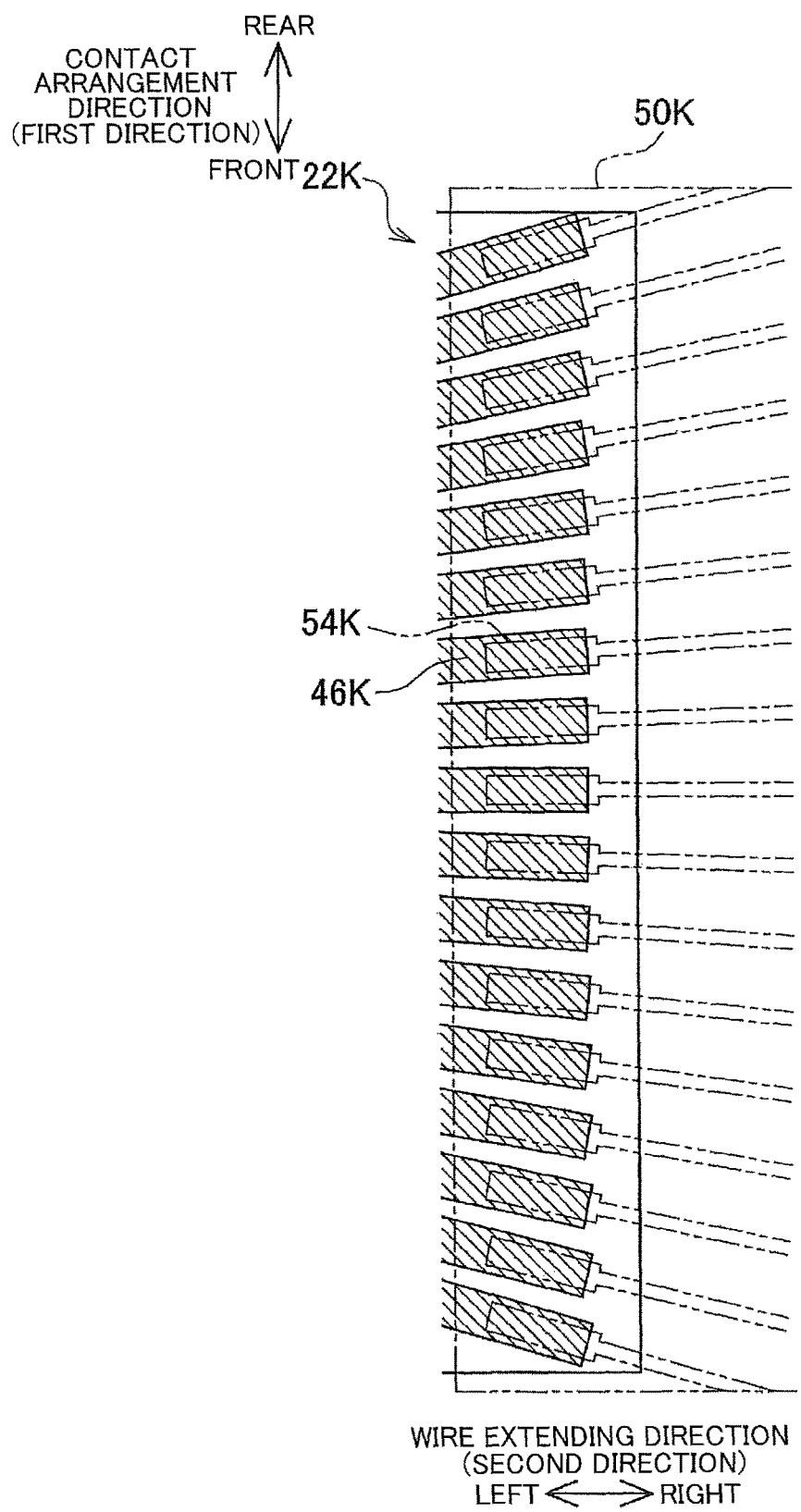
FIG. 22 is a plan view of a joined region of a piezoelectric actuator which is joined to a COF in yet another modification.

In joining of the COF by heat, the individual contacts disposed on the COF are in some cases displaced with respect to the driving contacts due to contraction of the COF before the adhesive is hardened. In this regard, in the construction in which the driving contacts 46K and the individual contacts 54 are arranged so as to fan out radially in the same directions as illustrated in FIG. 22, even when the positions of the individual contacts 54K are changed by contraction of the COF 50K, it is possible to superpose the individual contacts 54K on the respective driving contacts 46K by fine adjustment of the position of the COF 50K in the right and left direction.

Figure 23:
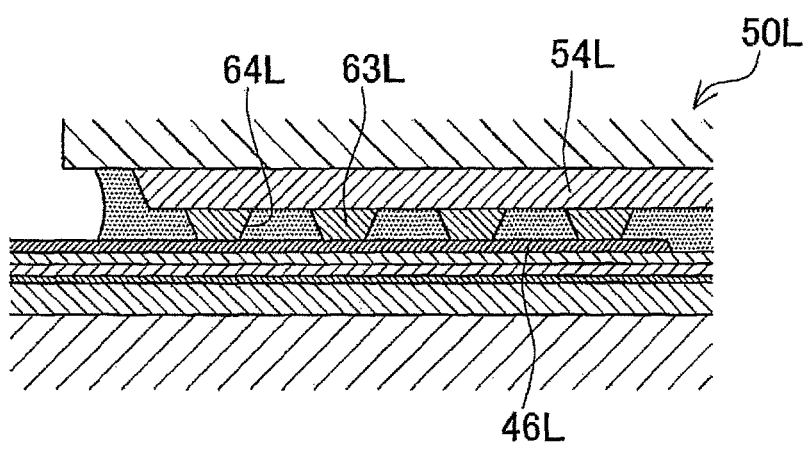
FIG. 23 is a cross-sectional view of joint portions of a piezoelectric actuator and a COF in yet another modification.

As illustrated in FIG. 23, protrusions 63L and recesses 64L may be formed on and in individual contacts 54L disposed on a COF 50L which are respectively connected to driving contacts 46L for the piezoelectric actuator.

In the above-described embodiment, the piezoelectric actuator and the COF are joined to each other with the non-conductive adhesive but may be joined to each other with conductive adhesive (ACF or ACP) containing conductive particles.

The arrangement of the driving contacts and the ground contacts in one ink-jet head 4 is not limited to the arrangement in the above-described embodiment (see FIGS. 2-4). For example, the ink-jet head may be configured such that all the wires of the piezoelectric elements are drawn in one direction, and all the driving contacts are arranged in a row at one end portion of the piezoelectric actuator. The ink-jet head may be configured such that all the wires of the piezoelectric elements are drawn toward a central portion of the piezoelectric actuator, and all the driving contacts are arranged in a row at the central portion of the piezoelectric actuator. The number of the ground contacts is not limited to two and may be one, or three or more.

While the present disclosure is applied to the ink-jet head configured to eject the ink onto the recording sheet to record an image in the above-described embodiment, the present disclosure may be applied to actuator devices used for purposes other than liquid ejection. Also, the actuator is not limited to the piezoelectric actuator including a plurality of piezoelectric elements. For example, the actuator may be an actuator including a heater as a drive element which causes driving by utilizing a heat generated when a current passes through the heater.

What is claimed is:

1. An actuator device, comprising:
   an actuator comprising a plurality of first contacts arranged in a first direction; and
   a wire member comprising a plurality of second contacts and joined to the actuator, the plurality of second contacts being arranged in the first direction and respectively connected to the plurality of first contacts,
   wherein each of a plurality of particular contacts comprises a protruding and recessed portion comprising: at least two protrusions; and a recess interposed between the at least two protrusions, and the plurality of particular contacts are the plurality of first contacts or the plurality of second contacts,
   wherein the plurality of particular contacts comprise: at least one central-region contact disposed on a central region in the first direction; and at least one end-region contact disposed nearer to an end region than to the central region in the first direction, and
   wherein a shape of the protruding and recessed portion of each of the at least one central-region contact is different from that of the protruding and recessed portion of each of the at least one end-region contact.

2. The actuator device according to claim 1, wherein an area of the recess of the protruding and recessed portion of each of the at least one end-region contact is greater than that of the recess of the protruding and recessed portion of each of the at least one central-region contact.

3. The actuator device according to claim 2, wherein the at least two protrusions of the protruding and recessed portion are arranged in a second direction orthogonal to the first direction and parallel with a plane on which the plurality of first contacts are arranged.

4. The actuator device according to claim 3,
   wherein a length of each of the at least one end-region contact in the first direction is greater than that of each of the at least one central-region contact in the first direction, and
   wherein a length of the recess of the protruding and recessed portion of each of the at least one end-region contact in the first direction is greater than that of the recess of the protruding and recessed portion of each of the at least one central-region contact in the first direction.

5. The actuator device according to claim 4,
   wherein a length of the recess of the protruding and recessed portion of each of the at least one end-region contact in the second direction is equal to that of the recess of the protruding and recessed portion of each of the at least one central-region contact in the second direction,
   wherein a length of each of the at least two protrusions of the protruding and recessed portion of each of the at least one end-region contact in the second direction is equal to that of each of the at least two protrusions of the protruding and recessed portion of each of the at least one central-region contact in the second direction,
   wherein a position of the recess of the protruding and recessed portion of each of the at least one end-region contact is identical to a position of the recess of the protruding and recessed portion of each of the at least one central-region contact, and
   wherein a position of each of the at least two protrusions of the protruding and recessed portion of each of the at least one end-region contact is identical in the second direction to a position of a corresponding one of the at least two protrusions of the protruding and recessed portion of each of the at least one central-region contact.

6. The actuator device according to claim 5,
   wherein the actuator comprises an actuator protrusion and an actuator recess at a region at which the plurality of first contacts are disposed, and each of the actuator protrusion and the actuator recess extends in the first direction, and
   wherein the plurality of first contacts are arranged in the first direction on the actuator protrusion and the actuator recess.

7. The actuator device according to claim 5, wherein a length of each of the at least one end-region contact in the second direction is equal to that of each of the at least one central-region contact in the second direction.

8. The actuator device according to claim 2, wherein a length of the recess of the protruding and recessed portion of each of the at least one end-region contact in the second direction is greater than that of the recess of the protruding and recessed portion of each of the at least one central-region contact in the second direction.

9. The actuator device according to claim 8, wherein a length of each of the at least one end-region contact in the second direction is greater than that of each of the at least one central-region contact in the second direction.

10. The actuator device according to claim 8, wherein a length of each of the at least one end-region contact in the first direction is equal to that of each of the at least one central-region contact in the first direction.

11. The actuator device according to claim 1, wherein the at least two protrusions of the protruding and recessed portion are arranged in the first direction.

12. The actuator device according to claim 1, wherein a position of each of the at least two protrusions and a position of the recess of the protruding and recessed portion of each of the at least one end-region contact are respectively different from a position of each of the at least two protrusions and a position of the recess of the protruding and recessed portion of each of the at least one central-region contact.

13. The actuator device according to claim 1, wherein the number of recesses of the protruding and recessed portion of each of the at least one end-region contact is greater than the number of recesses of the protruding and recessed portion of each of the at least one central-region contact.

14. The actuator device according to claim 1, wherein each of the plurality of first contacts comprises the protruding and recessed portion.

15. The actuator device according to claim 14,
wherein the actuator comprises a plurality of drive elements each comprising (i) a first electrode as one of a plurality of first electrodes and (ii) a second electrode as one of a plurality of second electrodes,
wherein the plurality of second electrodes of the plurality of drive elements are separated from each other,
wherein the plurality of first electrodes of the plurality of drive elements are joined to each other to constitute a common electrode,
wherein the plurality of first contacts comprise: a plurality of individual contacts respectively connected to the plurality of second electrodes; and a common-electrode contact connected to the common electrode, and
wherein each of the common-electrode contact and the plurality of individual contacts comprises the protruding and recessed portion.

16. The actuator device according to claim 15,
wherein the common-electrode contact is disposed nearer to the end region than the plurality of individual contacts in the first direction, and
wherein a shape of the protruding and recessed portion of the common-electrode contact is different from a shape of the protruding and recessed portion of each of the plurality of individual contacts.

17. The actuator device according to claim 16, wherein an area of each of the at least two protrusions of the protruding and recessed portion of the common-electrode contact is greater than that of each of the at least two protrusions of the protruding and recessed portion of each of the plurality of individual contacts.

18. The actuator device according to claim 15,
wherein the plurality of individual contacts comprise: at least one central-region individual contact disposed at a central region in the first direction; and at least one end-region individual contact disposed nearer to an end region than to the central region in the first direction, and
wherein a shape of the protruding and recessed portion of each of the at least one central-region individual contact is different from that of the protruding and recessed portion of each of the at least one end-region individual contact.

19. The actuator device according to claim 18, wherein an area of each of the at least two protrusions of the protruding and recessed portion of each of the at least one end-region individual contact is equal to that of each of the at least two protrusions of the protruding and recessed portion of each of the at least one central-region individual contact.

20. The actuator device according to claim 18,
wherein the plurality of individual contacts comprise a first individual contact and a second individual contact,
wherein a length of an electric path extending to the common-electrode contact from the second electrode of one of the plurality of drive elements which corresponds to the second individual contact is greater than that of an electric path extending to the common-electrode contact from the second electrode of one of the plurality of drive elements which corresponds to the first individual contact, and
wherein an area of each of the at least two protrusions of the protruding and recessed portion of the second individual contact is greater than that of each of the at least two protrusions of the protruding and recessed portion of the first individual contact.

21. The actuator device according to claim 20, wherein an area of each of the at least two protrusions of each of the plurality of individual contacts increases with increase in length of an electric path to the common-electrode contact from the second electrode of one of the plurality of drive elements which corresponds to said each of the plurality of individual contacts.

22. The actuator device according to claim 15,
wherein each of the plurality of drive elements is a piezoelectric element comprising a piezoelectric layer, the first electrode, and the second electrode, and the piezoelectric layer is interposed between the first electrode, and the second electrode in a direction of thickness of the piezoelectric layer,
wherein the actuator comprises a piezoelectric portion at a joined region at which the actuator is joined to the wire member, and the piezoelectric portion is formed of a piezoelectric material identical to a piezoelectric material, of which the piezoelectric layer is formed,
wherein a protruding and recessed surface is formed on the piezoelectric portion, and
wherein the plurality of first contacts are disposed so as to cover the protruding and recessed surface of the piezoelectric portion.

23. The actuator device according to claim 15,
wherein each of the plurality of drive elements is a piezoelectric element comprising a piezoelectric layer, the first electrode, and the second electrode, and the piezoelectric layer is interposed between the first electrode, and the second electrode in a direction of thickness of the piezoelectric layer,
wherein the actuator comprises an insulating layer on which the piezoelectric element is disposed, and the insulating layer extends to a joined region at which the actuator is joined to the wire member,
wherein a protruding and recessed surface is formed on a portion of the insulating layer which is located at the joined region, and
wherein the plurality of first contacts are disposed so as to cover the protruding and recessed surface of the insulating layer.

24. The actuator device according to claim 15,
wherein each of the plurality of first contacts comprises the protruding and recessed portion,
wherein each of the plurality of first contacts comprises: a base layer formed of a conductive material; and the at least two protrusions of the protruding and recessed portion, and wherein the at least two protrusions are disposed on the base layer so as to be spaced apart from each other, and the at least two protrusions are formed of a conductive material.

25. The actuator device according to claim 1,
wherein the plurality of first contacts are arranged so as to fan out radially toward one side in a second direction orthogonal to the first direction and parallel with a plane on which the plurality of first contacts are arranged, and
wherein the plurality of second contacts are arranged so as to fan out radially toward the one side in the second direction.

26. The actuator device according to claim 1, wherein the wire member and the actuator are joined with non-conductive adhesive in a state in which the plurality of first contacts and the plurality of second contacts are respectively in contact with each other.

* * * * *